US010098228B2

(12) United States Patent
Kyozuka

(10) Patent No.: US 10,098,228 B2
(45) Date of Patent: Oct. 9, 2018

(54) ELECTRONIC COMPONENT DEVICE AND METHOD FOR MANUFACTURING THE SAME

(71) Applicant: SHINKO ELECTRIC INDUSTRIES CO., LTD., Nagano-shi, Nagano (JP)

(72) Inventor: Masahiro Kyozuka, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 169 days.

(21) Appl. No.: 14/833,578

(22) Filed: Aug. 24, 2015

(65) Prior Publication Data

US 2016/0057863 A1 Feb. 25, 2016

(30) Foreign Application Priority Data

Aug. 25, 2014 (JP) ................................ 2014-170410

(51) Int. Cl.
*H05K 1/14* (2006.01)
*H01L 23/538* (2006.01)
(Continued)

(52) U.S. Cl.
CPC ........... *H05K 1/144* (2013.01); *H01L 21/486* (2013.01); *H01L 23/3121* (2013.01);
(Continued)

(58) Field of Classification Search
CPC ....... H05K 1/144; H01L 25/50; H01L 25/105; H01L 23/5385; H01L 23/5389;
(Continued)

(56) References Cited

U.S. PATENT DOCUMENTS 7,732,712 B2 * 6/2010 Yamano .............. H01L 23/3677
174/260
7,937,828 B2 * 5/2011 Yamano .............. H01L 21/4857
174/254
(Continued)

FOREIGN PATENT DOCUMENTS

JP 2003-347722 12/2003
JP 2008-010885 1/2008
(Continued)

OTHER PUBLICATIONS

Japanese Office Action with English Translation dated Dec. 26, 2017, 7 pages.

*Primary Examiner* — Nathan Milakovich
(74) *Attorney, Agent, or Firm* — Rankin, Hill & Clark LLP

(57) ABSTRACT

An electronic component device includes a cored wiring substrate, an electronic component, a reinforcing layer, a connection terminal, and sealing resin. The cored wiring substrate includes a core layer. The electronic component is mounted on the cored wiring substrate. The coreless wiring substrate is disposed on the cored wiring substrate and the electronic component. The reinforcing layer is provided in the coreless wiring substrate and in a region corresponding to the electronic component. The connection terminal connects the cored wiring substrate and the coreless wiring substrate. The sealing resin is filled between the cored wiring substrate and the coreless wiring substrate.

8 Claims, 41 Drawing Sheets

(51) Int. Cl.

| | |
|---|---|
| ***H01L 23/31*** | (2006.01) |
| ***H01L 21/48*** | (2006.01) |
| ***H01L 25/10*** | (2006.01) |
| ***H01L 25/00*** | (2006.01) |
| *H01L 23/498* | (2006.01) |
| *H01L 25/065* | (2006.01) |

(52) U.S. Cl.

CPC ...... *H01L 23/3135* (2013.01); *H01L 23/5385* (2013.01); *H01L 23/5389* (2013.01); *H01L 25/105* (2013.01); *H01L 25/50* (2013.01); *H01L 23/49811* (2013.01); *H01L 23/5384* (2013.01); *H01L 25/0655* (2013.01); *H01L 2224/16227* (2013.01); *H01L 2224/32225* (2013.01); *H01L 2224/73204* (2013.01); *H01L 2225/1023* (2013.01); *H01L 2225/1041* (2013.01); *H01L 2225/1058* (2013.01); *H01L 2924/1533* (2013.01); *H01L 2924/15311* (2013.01); *H01L 2924/18161* (2013.01); *H05K 2201/042* (2013.01); *H05K 2201/10242* (2013.01)

(58) Field of Classification Search

CPC ... H01L 2924/18161; H01L 2924/1533; H01L 2924/15311; H01L 2225/1058; H01L 2225/1041; H01L 2225/1023

See application file for complete search history.

(56) References Cited

U.S. PATENT DOCUMENTS

| | | | | |
|---|---|---|---|---|
| 7,989,707 | B2 * | 8/2011 | Yamano | H01L 21/565 174/260 |
| 8,198,541 | B2 * | 6/2012 | Sasaoka | H05K 1/0206 174/252 |
| 8,609,998 | B2 * | 12/2013 | Miyasaka | H01L 23/49822 174/262 |
| 8,901,725 | B2 * | 12/2014 | Tateiwa | H01L 24/19 257/686 |
| 8,941,230 | B2 * | 1/2015 | Kyozuka | H01L 24/19 174/256 |
| 9,013,037 | B2 * | 4/2015 | Jin | H01L 23/3114 257/737 |
| 9,257,373 | B2 * | 2/2016 | Nakamura | H01L 23/49822 |
| 9,293,406 | B2 * | 3/2016 | Chino | H01L 23/49827 |
| 2006/0208356 | A1 * | 9/2006 | Yamano | H01L 21/6835 257/734 |
| 2008/0099912 | A1 * | 5/2008 | Wu | H01L 23/142 257/737 |
| 2009/0126982 | A1 * | 5/2009 | Nakamura | H01L 21/6835 174/262 |
| 2010/0132995 | A1 | 6/2010 | Kaneko | |
| 2012/0175157 | A1 | 7/2012 | Kaneko | |
| 2013/0049214 | A1 * | 2/2013 | Nikitin | H01L 24/19 257/774 |
| 2014/0239428 | A1 * | 8/2014 | Pueschner | H01L 31/02 257/428 |
| 2015/0124422 | A1 * | 5/2015 | Funahashi | H01L 27/14618 361/772 |

FOREIGN PATENT DOCUMENTS

| | | |
|---|---|---|
| JP | 2008-135781 | 6/2008 |
| JP | 2010-129899 A | 6/2010 |
| JP | 2012-060159 A | 3/2012 |

* cited by examiner

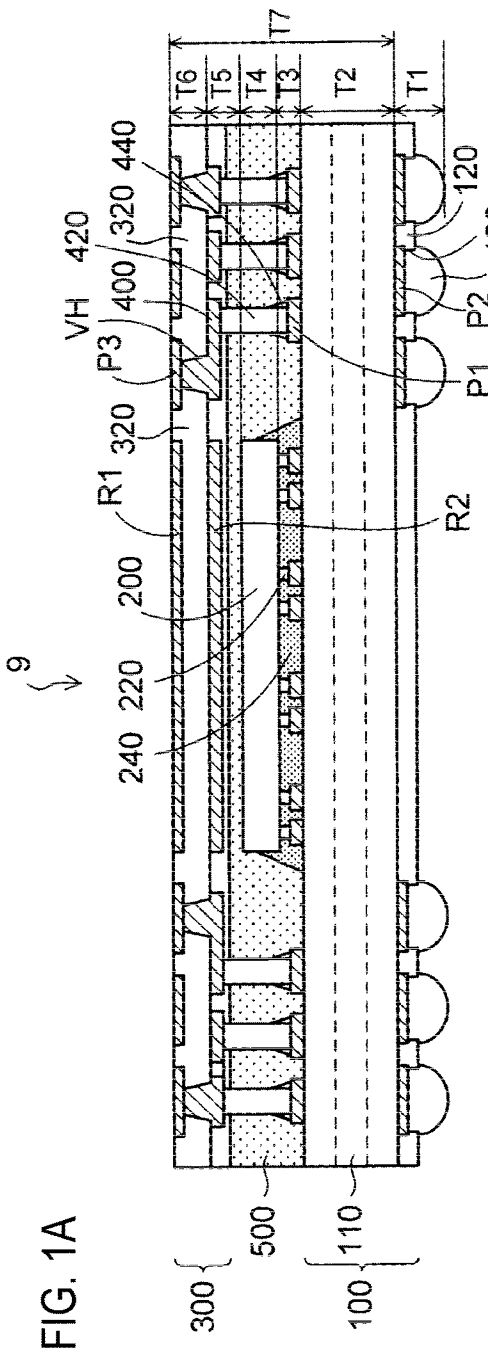
FIG. 1A
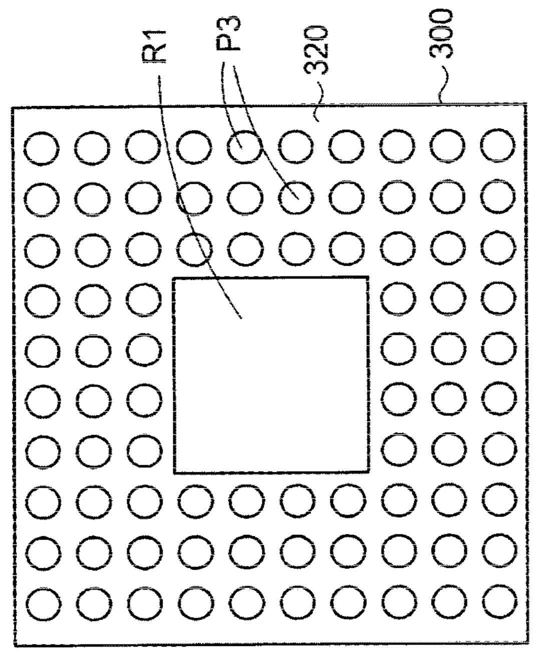
FIG. 1B
| | |
|---|---|
| T1 | 170 µm |
| T2 | 200 µm |
| T3 | 30 µm |
| T4 | 50 µm |
| T5 | 40 µm |
| T6 | 30 µm |
| T7 | 350 µm |
FIG. 1C

| | LEG1 | LEG2 | LEG3 | LEG4 |
|---|---|---|---|---|
| | No reinforcing layers | w/o reinforcing layer R1<br>w/ reinforcing layer R2 | w/ reinforcing layer R1<br>w/o reinforcing layer R2 | w/ reinforcing layer R1<br>w/ reinforcing layer R2 |
| Room Temperature | 100% | 94% | 46% | 46% |
| 260°C | 100% | 77% | 54% | 42% |

ELECTRONIC COMPONENT DEVICE AND METHOD FOR MANUFACTURING THE SAME

CROSS-REFERENCE TO RELATED APPLICATION(S)

This application claims priority from Japanese Patent Application No. 2014-170410, filed on Aug. 25, 2014, the entire contents of which are herein incorporated by reference.

BACKGROUND

Field

Exemplary embodiments of the invention relate to an electronic component device and a method for manufacturing the same.

Related Art

There has been an electronic component device in which an upper wiring substrate is stacked on a lower wiring substrate that is mounted with an electronic component such as a semiconductor chip, and sealing resin is filled between the lower wiring substrate and the upper wiring substrate. In this electronic component device, the lower wiring substrate and the upper wiring substrate are connected by solder balls or the like, and the electronic component is housed in a space between the upper and lower wiring substrates.

SUMMARY

With advancement in performance of portable apparatus such as smartphones, electronic component devices built in the portable apparatus have been required to be further reduced in thickness and size.

According to a method using a thin substrate simply in order to make an electronic component device thinner and smaller in size, a substrate may be warped due to thermal stress that is generated in a manufacturing process. It is, therefore, difficult to manufacture the electronic component device with high reliability.

In addition, since the electronic component device obtained finally is warped, it is difficult to mount the electronic component device on a mounting board with high reliability, and it is also difficult to mount another semiconductor package on the electronic component device.

One exemplary embodiment of the invention provides an electronic component device in which the electronic component device can be made thinner and smaller in size and occurrence of warpage can be suppressed even though the electronic component device is made thinner, and provides a method for manufacturing the electronic component device.

According to one exemplary embodiment, an electronic component device includes a cored wiring substrate, an electronic component, a reinforcing layer, a connection terminal, and sealing resin. The cored wiring substrate includes a core layer. The electronic component is mounted on the cored wiring substrate. The coreless wiring substrate is disposed on the cored wiring substrate and the electronic component. The reinforcing layer is provided in the coreless wiring substrate and in a region corresponding to the electronic component. The connection terminal connects the cored wiring substrate and the coreless wiring substrate. The sealing resin is filled between the cored wiring substrate and the coreless wiring substrate.

A method for manufacturing an electronic component device, the method comprising:

preparing a cored wiring substrate comprising a core layer;

mounting an electronic component on the cored wiring substrate;

forming a coreless wiring substrate on a support so as to obtain a wiring member, the coreless wiring substrate comprising a reinforcing layer in a region corresponding to the electronic component;

putting the wiring member on the coreless wiring substrate through a connection terminal with the support up, so as to house the electronic component between the cored wiring substrate and the wiring member;

filling sealing resin between the cored wiring substrate and the upper wiring member; and removing the support from the upper wiring member.

According to the following disclosure, an electronic component device has such a structure that an upper wiring substrate is stacked, through a connection terminal, on a lower wiring substrate mounted with an electronic component.

The lower wiring substrate mounted with the electronic component on an upper surface thereof easily warps convexly because of thermal stress that is generated due to a difference in thermal expansion coefficient between the electronic component and the lower wiring substrate.

According to one exemplary embodiment, the lower wiring substrate is a cored substrate having a core layer. The upper wiring substrate is a coreless substrate. A reinforcing layer is formed in the upper wiring substrate so that the warpage of the lower wiring substrate is corrected.

According to another exemplary embodiment, at least one of the lower wiring substrate and the upper wiring substrate may be a coreless substrate provided with a reinforcing layer.

BRIEF DESCRIPTION OF THE DRAWINGS

FIG. 1A is a sectional view showing a structure of an electronic component device that is used in simulation for analyzing warpage of the electronic component device;

FIG. 1B is a plan view showing the structure of the electronic component device, which is used in the simulation;

FIG. 1C is a table indicating thicknesses of respective portions in the structure of the electronic component device, which is used in the simulation;

DETAILED DESCRIPTION

Figures 2A, 2B:
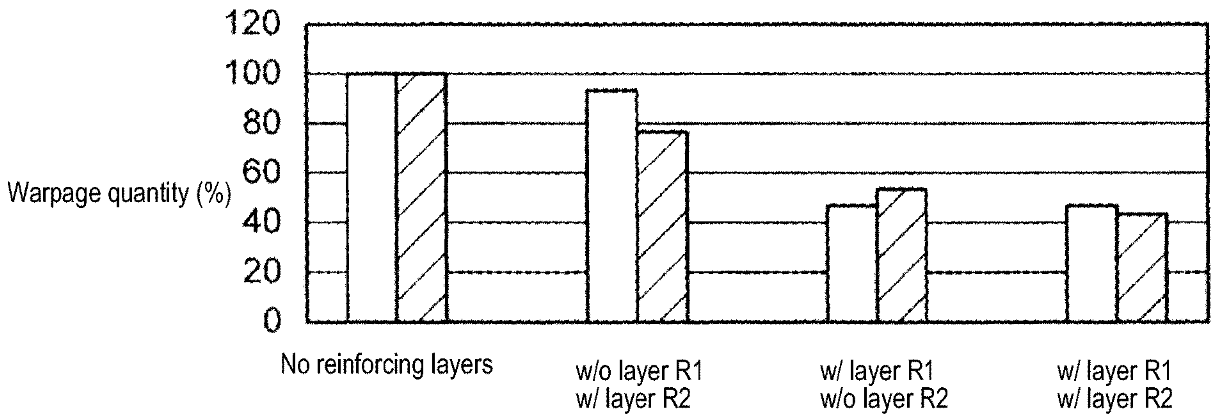
FIG. 2A is a table showing analysis results of the warpage of the electronic component device in FIG. 1 based on the simulation.
FIG. 2B is a graph showing the analysis results of the warpage of the electronic component device in FIG. 1 based on the simulation.

Exemplary embodiments will be described below with reference to the accompanying drawings.

Analysis results of warpage of electronic component devices based on simulation performed by the inventor will be described before description on the exemplary embodiments are given.

First, the structure of each of electronic component devices which are assumed in the simulation will be described. As shown in FIG. 1A, a lower wiring substrate 100 of an electronic component device 9 is formed with a core layer 110 in a thickness-direction central portion thereof. The core layer 110 may be made of glass epoxy resin or the like.

Buildup wiring layers (not shown) are formed on both surfaces of the core layer 110, respectively. The buildup wiring layers on the both sides are connected to each other via through conductors (not shown) penetrating the core layer 110 in the thickness direction thereof. The lower wiring substrate 100 is provided with pads P1 and P2 on the both sides. The pads P1 and P2 are the outermost elements of the respective buildup wiring layers.

Also, a solder resist layer 120 formed with opening portions 120*a* on the pads P2 are formed on a lower surface of the lower wiring substrate 100. Furthermore, external connection terminals T are provided for the pads P2 on the lower surface side of the lower wiring substrate 100.

Bump electrodes 220 of a semiconductor chip 200 are flip-chip connected to the pads P1 disposed in a central portion on an upper surface side of the lower wiring substrate 100. Underfill resin 240 is filled below the semiconductor chip 200.

Also, an upper wiring substrate 300 is disposed on the lower wiring substrate 100 so as to house the semiconductor chip 200. The upper wiring substrate 300 is provided with pads P3 on a circumferential portion of an upper surface of an insulating layer 320. Each pad P3 is formed so that a side surface and a lower surface of the pad P3 are embedded in the insulating layer 320 while an upper surface of the pad P3 is exposed.

Furthermore, a wiring layer 400 is formed on a lower surface of the insulating layer 320. Via holes VH are formed in the insulating layer 320. The via holes VH reach the pads P3. The pads P3 are connected to the wiring layer 400 through via conductors provided in the via holes VH.

Each via hole VH is formed into an inverted tapered shape whose diameter increases from top toward bottom.

Metal pillars 420 are formed in connection portions of the wiring layer 400 of the upper wiring substrate 300. Lower portions of the metal pillars 420 are connected to the connection pads P1 of the lower wiring substrate 100 through solder 440.

Also, a first reinforcing layer R1 is formed at a central portion of the upper surface of the insulating layer 320. The first reinforcing layer R1 is at the same height as the pads P3 disposed around the first reinforcing layer R1 is. The first reinforcing layer R1 is formed so that a side surface and a lower surface thereof are embedded in the insulating layer 320.

A second reinforcing layer R2 is formed in the lower surface of the insulating layer 320 and in a region corresponding to the first reinforcing layer R1. The second reinforcing layer R2 is at the same height the wiring layer 400 is. A side surface and a lower surface of the second reinforcing layer R2 are exposed from the interlayer insulating layer 320.

Furthermore, sealing resin 500 is filled between the lower wiring substrate 100 and the upper wiring substrate 300. Thus, the semiconductor chip 200 can be sealed with the sealing resin 500. The first reinforcing layer R1 and the second reinforcing layer R2 are disposed in a region corresponding to the semiconductor chip 200.

FIG. 1B is a reduced plan view of the electronic component device 9. When the electronic component device 9 is observed in the plan view, the first reinforcing layer R1 is disposed in the central portion of the upper surface of the insulating layer 320 of the upper wiring substrate 300, and the plurality of connection pads P3 are arranged in a region around the first reinforcing layer R1.

As described above, the lower wiring substrate 100 is formed as a cored substrate having the core layer 110. Also, the upper wiring substrate 300 is formed as a coreless substrate having no core layer.

Next, dimensions of respective elements of each electronic component device 9 used in the simulation will be described. FIG. 1C is a table indicating thicknesses T1 to T7 of the respective elements in the electronic component device 9.

An area of the semiconductor chip 200 was 10 mm by 10 mm. An area of each of the first and second reinforcing layers R1 and R2 was 10 mm by 10 mm. A total area of the electronic component device 9 was 15 mm by 15 mm.

As shown in FIG. 2A, it was assumed in Condition LEG1 that neither the first nor second reinforcing layers R1, R2 was formed in the electronic component device 9 in FIGS. 1A to 1C.

It was assumed in Condition LEG2 that the first reinforcing layer R1 was not formed but only the second reinforcing layer R2 was formed on the lower surface side of the insulating layer 320 of the upper wiring substrate 300.

It was assumed in Condition LEG3 that the second reinforcing layer R2 was not formed but only the first reinforcing layer R1 was formed on the upper surface side of the insulating layer 320 of the upper wiring substrate 300.

It was assumed in Condition LEG4 that both of the first and second reinforcing layers R1 and R2 were formed in the electronic component device 9.

Models for the simulation were prepared based on the electronic component devices 9 having the above-described structures.

Figure 2C:
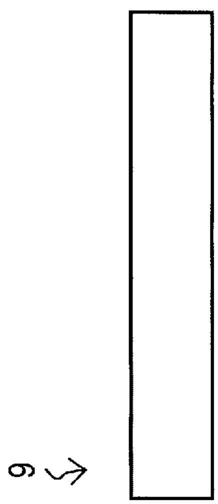
FIGS. 2C and 2D are views showing definition of a warpage quantity of an electronic component device.
Figure 2D:
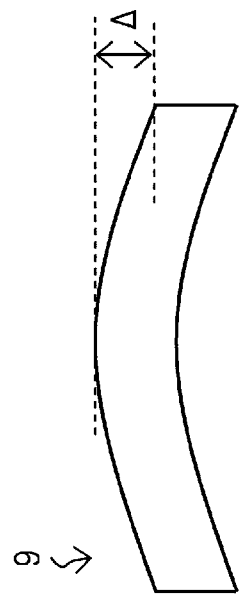

In this specification, a warpage quantity of an electronic component device is defined as a distance Δ between an uppermost point and a lowermost point in the same surface of the electronic component device as shown in FIG. 2D. If an electronic component device is in an ideal state where upper and lower surfaces of the electronic component device are complete flat as shown in FIG. 2C, a warpage quantity of the electronic component device is 0.

As shown in the table of FIG. 2A and a graph of FIG. 2B, the electronic component device 9 was warped convexly at a room temperature and at an atmosphere of 260° C. under the condition LEG1. This is because neither the first nor second reinforcing layers R1, R2 are provided. The warpage quantities of the electronic component device 9 at the room temperature and at an atmosphere of 260° C. under the condition LEG1 were $\Delta_{LEG1\_RT}$ and $\Delta_{LEG1\_260}$. Here, relative warpage quantities of an electronic component device 9 at the room temperature and at the atmosphere of 260° C. are defined as $\Delta_{RT}/\Delta_{LEG1\_RT}$ and $\Delta_{260}/\Delta_{LEG1\_260}$. Under the condition LEG1, relative warpage quantities of the electronic component device 9 at the room temperature and at an atmosphere of 260° C. under the condition LEG1 are 100% ($=\Delta_{LEG1\_RT}/\Delta_{LEG1\_RT}$) and 100% ($\Delta_{LEG1\_260}/\Delta_{LEG1\_260}$).

Under the condition LEG2 where only the second reinforcing layer R2 was formed on the lower surface side of the insulating layer 320 of the upper wiring substrate 300, a relative warpage quantity at the room temperature was 94% ($=\Delta_{LEG2\_RT}/\Delta_{LEG1\_RT}$) and a relative warpage quantity at the atmosphere of 260° C. was 77% ($=\Delta_{LEG2\_260}/\Delta_{LEG1\_260}$). A satisfactory effect in correcting the warpage was not achieved.

Also, under the condition LEG3 where only the first reinforcing layer R1 was formed on the upper surface side of the insulating layer 320 of the upper wiring substrate 300, a relative warpage quantity at the room temperature was improved to be 46% ($=\Delta_{LEG3\_RT}/\Delta_{LEG1\_RT}$) and a relative warpage quantity at the atmosphere of 260° C. was 54% ($=\Delta_{LEG3\_260}/\Delta_{LEG1\_260}$). A satisfactory effect in correcting the warpage was achieved.

Furthermore, under the condition LEG4 where both the first and second reinforcing layers R1 and R2 were formed, a relative warpage quantity at the room temperature was 46% ($=\Delta_{LEG4\_RT}/\Delta_{LEG1\_RT}$) and a relative warpage quantity at the atmosphere of 260° C. was 42% ($=\Delta_{LEG4\_260}/$ $\Delta_{LEG1\_260}$). A satisfactory effect in correcting the warpage was achieved under the condition LEG4 similarly to under the condition LEG3.

From the above-described simulations, it was proved that forming the first reinforcing layer R1 on the upper surface side of the insulating layer 320 of the upper wiring substrate 300 offers a higher effect in correcting the warpage than forming the second reinforcing layer R2 on the lower surface side of the insulating layer 320 of the upper wiring substrate 300.

In this manner, the inventor found out that warpage can be corrected satisfactorily in an electronic component device in which a coreless substrate is stacked on a cored substrate mounted with a semiconductor chip, by forming a reinforcing layer on the upper surface side of an insulating layer of the coreless substrate and at a certain distance from the semiconductor chip.

This is because the reinforcing layer of the coreless substrate can resist stress by which the core substrate mounted with the semiconductor chip will be warped into a convex shape.

Also, in a case where the cored substrate and the coreless substrate are replaced by each other in the electronic component device 9 shown in FIG. 1 and in a case where both the upper and lower substrates are coreless substrates, occurrence of warpage can be suppressed similarly by forming a reinforcing layer on an outer surface side of an insulating layer of the coreless substrate.

First Exemplary Embodiment

FIGS. 3A to 19 are views showing a method for manufacturing an electronic component device according to a first exemplary embodiment. FIG. 20 is a view showing the electronic component device according to the first exemplary embodiment. In this exemplary embodiment, description will be given on the structure of the electronic component device while the method for manufacturing the electronic component device is explained.

The electronic component device has the following structure. That is, an electronic component is mounted on a lower wiring substrate. An upper wiring substrate is stacked on the lower wiring substrate through connection terminals. In the first exemplary embodiment, a cored wiring substrate having a core layer is used as the lower wiring substrate, and a coreless substrate having no core layer is used as the upper wiring substrate.

At first, description will be given on a method for manufacturing an upper coreless wiring substrate serving as the upper wiring substrate of the electronic component device according to the first exemplary embodiment.

Figure 3A:
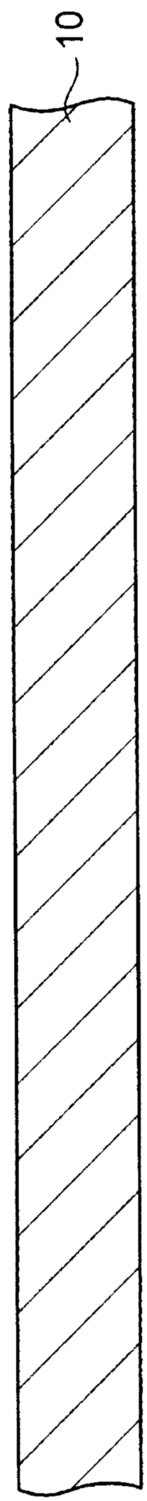
FIG. 3A and FIG. 3B are sectional views (part 1) showing a method for manufacturing an electronic component device according to a first exemplary embodiment.
Figure 3B:
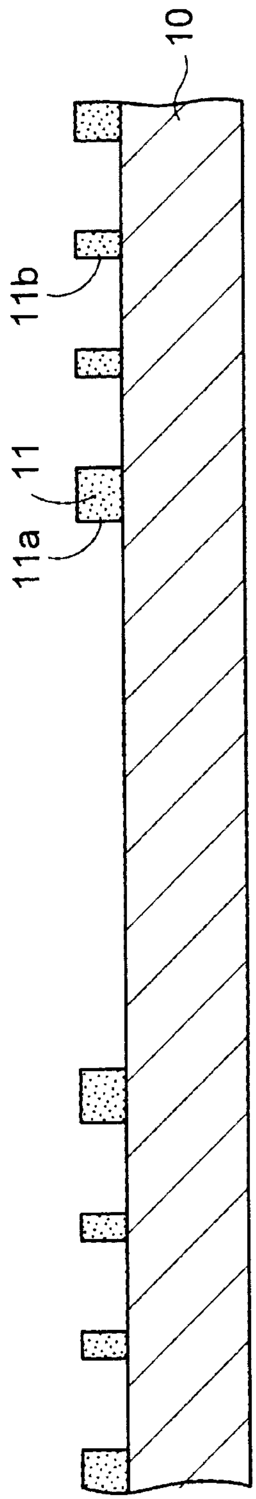

As shown in FIG. 3A, a support body 10 made of copper foil or the like is prepared. Then, a plating resist layer 11 is patterned on the support body 10 by photolithography as shown in FIG. 3B.

In the plating resist layer 11, a first opening portion 11*a* having a square shape in a plan view is formed in a central portion thereof. A plurality of second opening portions 11*b* are formed (may be separately from each other) in a region around the first opening portion 11*a*.

Figure 4A:
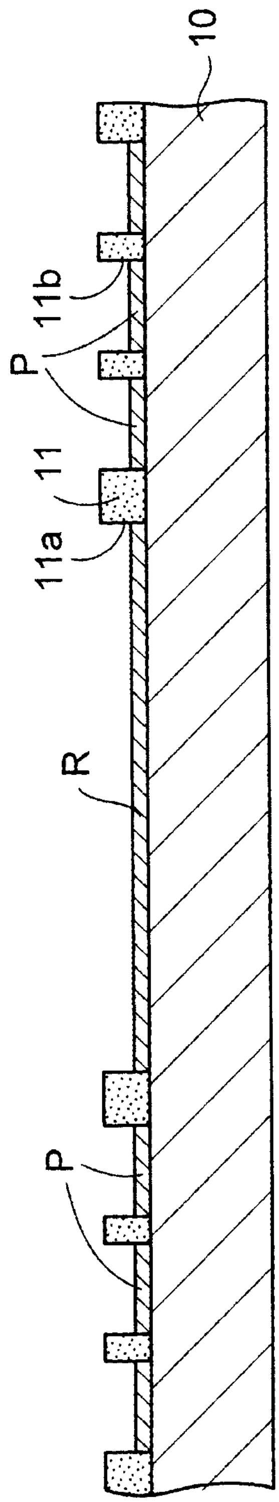
FIG. 4A and FIG. 4B are sectional views (part 2) showing the manufacturing method according to the first exemplary embodiment.

Subsequently, electrolytic plating is performed by using the support body 10 as a power supply path. Thereby, as shown in FIG. 4A, metal plated layers are formed on the support body 10 and in the first opening portion 11*a* and the second opening portions 11*b* of the plating resist layer 11.

Figure 4B:
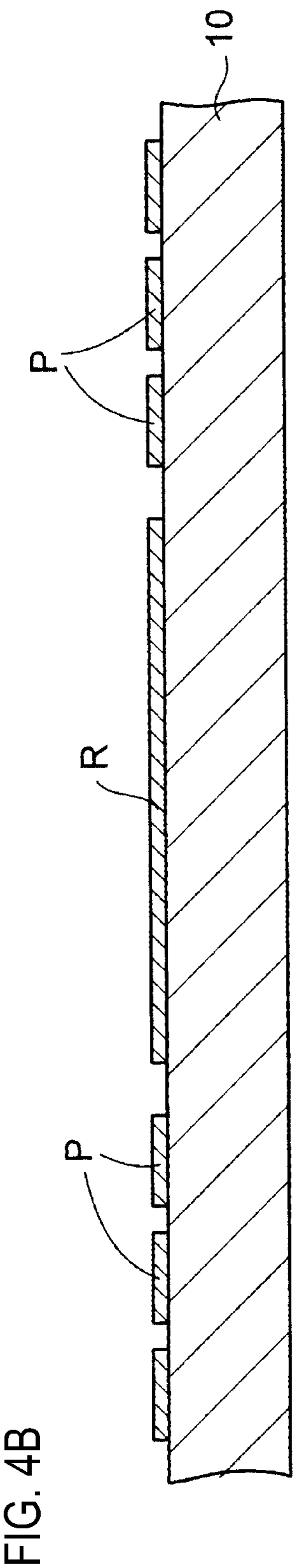

The metal plated layer formed in the first opening portion 11*a* of the plating resist layer 11 serves as a reinforcing layer R. The metal plated layers formed in the second opening portions 11*b* serve as pads P. Thicknesses of the reinforcing layer R and the pads P are, for example, in a range of from 10 μm to 20 μm. After that, the plating resist layer 11 is removed as shown in FIG. 4B.

As will be described later, a multilayer wiring layer is formed on the support body 10, and thereafter the support body 10 is removed from the multilayer wiring layer by wet etching in a predetermined stage.

Thus, when the support body 10 is made of copper, the lowermost layers of the reinforcing layer R and the pads P are made of gold (Au) layers or Ni (nickel) layers which have resistance against wet etchant for copper.

Examples of the reinforcing layer R and the pads P include a stack film of gold (Au) layer/palladium (Pd) layer/nickel (Ni) layer/copper (Cu) layer, a stack film of gold (Au) layer/nickel (Ni) layer/copper (Cu) layer, or a stack film of nickel (Ni) layer/copper (Cu) layer in order from bottom.

In a case where the pads P are formed of any of the stack films listed above, an outer surface of the pad P is flush with an outer surface of the insulating layer around the pads P when the support body 10 is removed.

Where the pads P are recessed from a front surface of the insulating layer around the pads P toward an inner side of the insulating layer, a copper layer having a thickness corresponding to a distance by which the pads P are recessed is additionally formed under the lowermost gold layer or the lowermost nickel layer. As a result, the lowermost copper layer is removed simultaneously when the support body 10 (copper) is removed. Thereby, a structure in which the pads P are recessed from the front surface of the insulating layer around the pad P can be obtained.

Also, the pads P in a coreless substrate may be formed in the following manner. That is, a stack film of copper layer/nickel layer/copper layer is formed on the support body 10 made of copper. The support body 10 and the copper layer are removed. The nickel layer may be further removed so that each pads P made of copper are recessed from the front surface of the insulating layer around the pads P toward the inner side of the insulating layer.

Figure 5A:
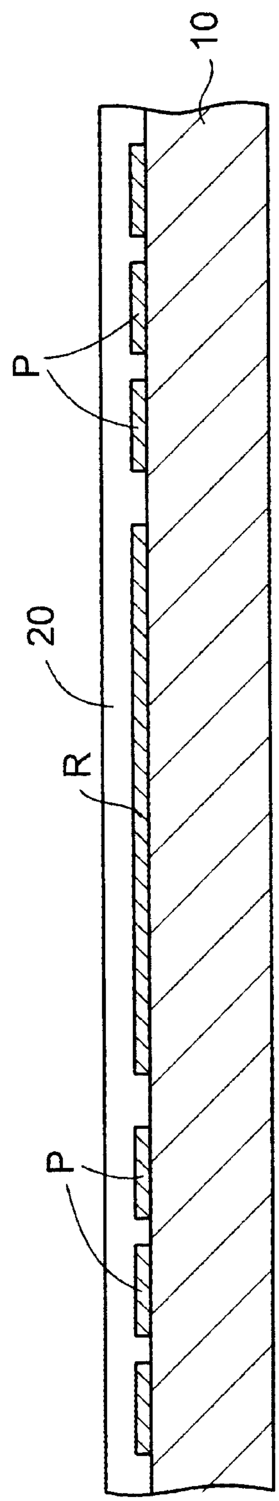
FIG. 5A and FIG. 5B are sectional views (part 3) showing the manufacturing method according to the first exemplary embodiment.

Next, as shown in FIG. 5A, uncured resin film is pasted onto the support body 10, the reinforcing layer R and the pads P and cured by heat treatment. Thereby, an insulating layer 20 is formed. The insulating layer 20 has, for example, about 20 μm to about 35 μm in thickness. For example, non-photosensitive thermosetting insulating resin is used as the resin film. Examples of such insulating resin include epoxy resin, polyimide resin, etc.

Figure 5B:
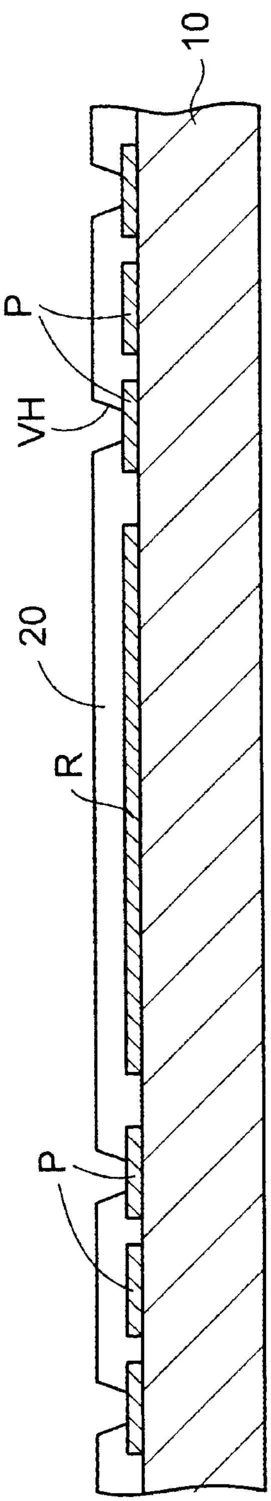

After that, as shown in FIG. 5B, the insulating layer 20 is processed by a laser to form via holes VH that reach the pads P. Furthermore, desmear treatment is applied to inside of each via hole VH in a permanganic acid method or the like, so as to eliminate resin smear and clean the via hole VH.

Figure 6A:
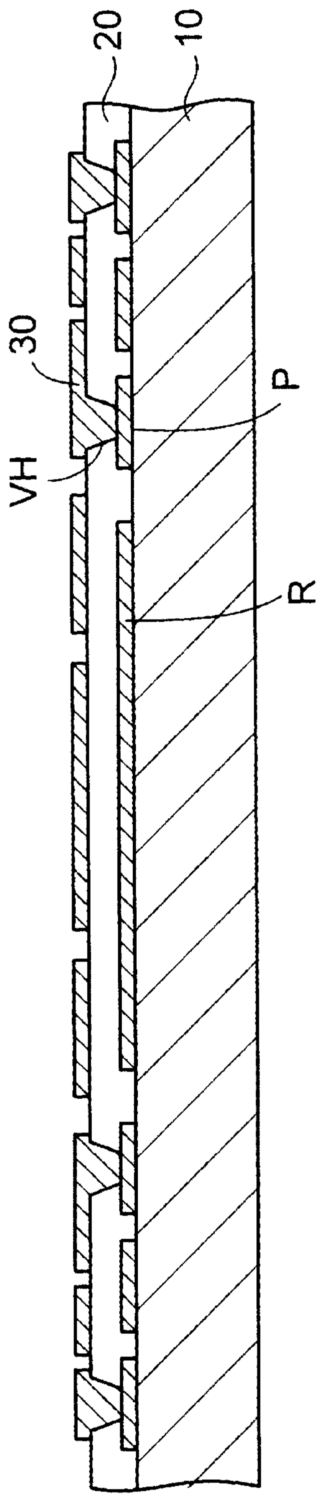
FIG. 6A and FIG. 6B are sectional views (part 4) showing the manufacturing method according to the first exemplary embodiment.

Next, as shown in FIG. 6A, a wiring layer 30 is formed on the insulating layer 20 so as to be connected to the pads P through via conductors in the via holes VH. The wiring layer 30 is formed by the semi-additive method.

Detailed description will be given with reference to FIGS. 7A to 7D. In FIGS. 7A to 7D, a region of one of the pads P in FIG. 6A is shown partially.

Figure 7A:
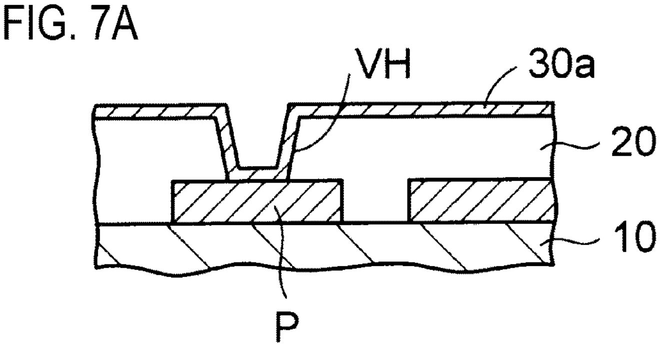
FIG. 7A to FIG. 7D are sectional views (part 5) showing the manufacturing method according to the first exemplary embodiment.

Description will be made in detail. As shown in FIG. 7A, a seed layer 30*a* made of copper or the like is formed on the insulating layer 20 and on an inner surface of the via hole VH, by an electroless plating method or a sputtering method.

Figure 7B:
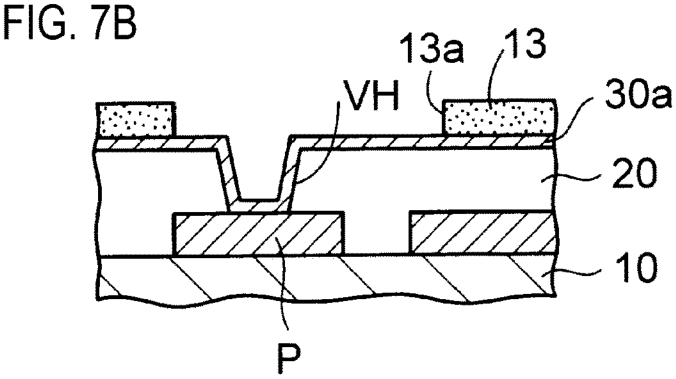

Next, as shown in FIG. 7B, a resist layer 13 having an opening portion 13*a* is formed. The opening portion 13*a* is provided in a region where the wiring layer 30 is disposed.

Figure 7C:
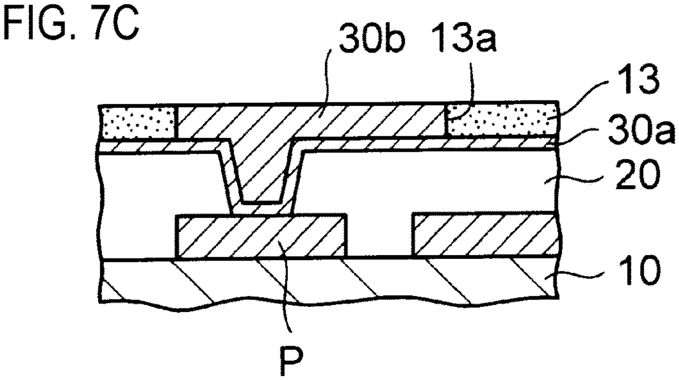
Figure 7D:
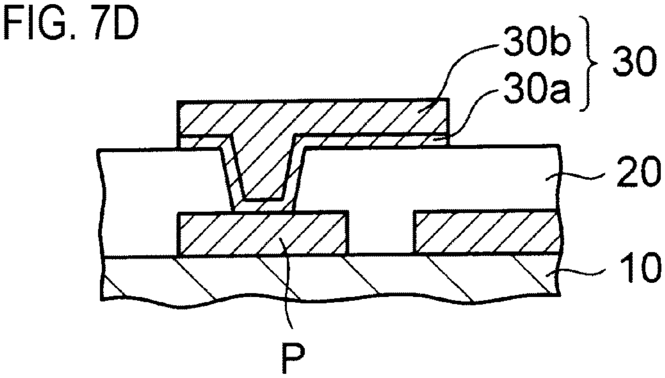

Subsequently, as shown in FIG. 7C, a metal plated layer 30*b* made of copper or the like is formed in the opening portion 13*a* of the plating resist layer 13 by electrolytic plating using the seed layer 30*a* as a power supply path. After that, as shown in FIG. 7D, the plating resist layer 13 is removed. The seed layer 30*a* is then removed by wet etching using the metal plated layer 30*b* as a mask. As a result, a wiring layer 30 is formed of the seed layer 30*a* and the metal plated layer 30*b*. The wiring layer 30 has, for example, about 10 μm to about 20 μm in thickness. On the other hand, L/S (line (width) and space (interval)) of the wiring layer 30 can be formed to be about 15 μm/15 μm or more minute.

Next, referring back to FIG. 6B, a solder resist layer 24 is formed on the insulating layer 20 and the wiring layer 30. The solder resist layer 24 is formed with opening portions 24*a* above connection portions of the wiring layer 30. The solder resist layer 24 has, for example, about 20 μm to about 40 μm in thickness. Photosensitive insulating resin including phenol resin, polyimide resin or the like is used for the solder resist layer 24.

Figure 8A:
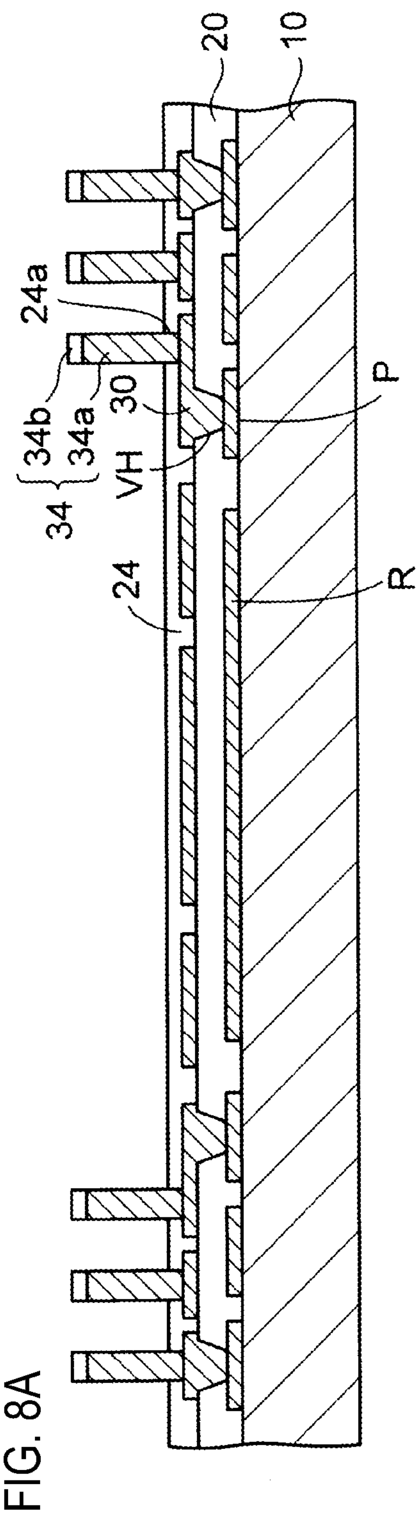
FIG. 8A and FIG. 8B are sectional views (part 6) showing the manufacturing method according to the first exemplary embodiment.

Subsequently, as shown in FIG. 8A, metal pillars 34 are formed on the wiring layer 30 and in the opening portions 24*a* of the solder resist layer 24. Each metal pillar 34 includes a pillar portion 34*a* and a solder layer 34*b* on the pillar portion 34*a*. The metal pillar 34 is an example of a connection terminal.

Detailed description will be given with reference to FIGS. 9A to 9E. FIGS. 9A to 9E partially show a region including one of the opening portions 24*a* of the solder resist layer 24 in FIG. 8A.

Figure 9A:
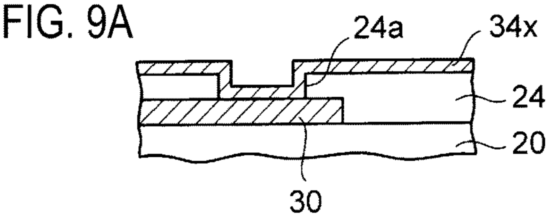
FIG. 9A to FIG. 9E are sectional views (part 7) showing the manufacturing method according to the first exemplary embodiment.

As shown in FIG. 9A, first, a seed layer 34*x* made of copper or the like is formed on the solder resist layer 24 and on an inner surface of the opening portion 24*a*, by an electroless plating method or a sputtering method.

Figure 9B:
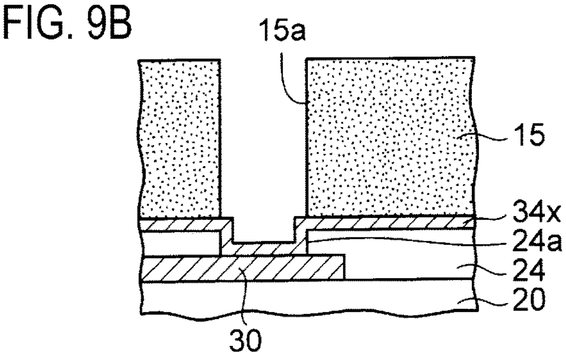

Next, as shown in FIG. 9B, a plating resist layer 15 is formed by photolithography. The plating resist layer 15 is formed with an opening portion 15*a* on the seed layer 34*x* which is disposed in the opening portion 24*a* of the solder resist layer 24.

Figure 9C:
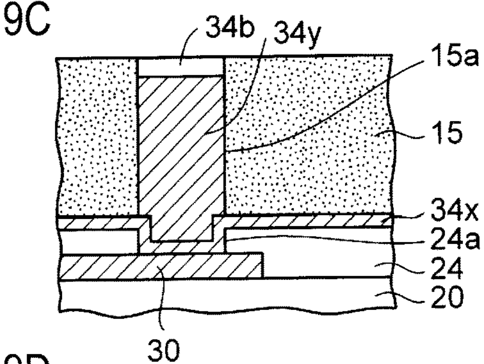

Furthermore, as shown in FIG. 9C, a metal plated layer 34*y* made of copper or the like is formed by electrolytic plating using the seed layer 34*x* as a power supply path. After that, a solder layer 34*b* is formed on the metal plated layer 34*y* by similar electrolytic plating. For example, tin (Sn)/silver (Ag) based solder is used as the solder layer 34*b*.

Figure 9D:
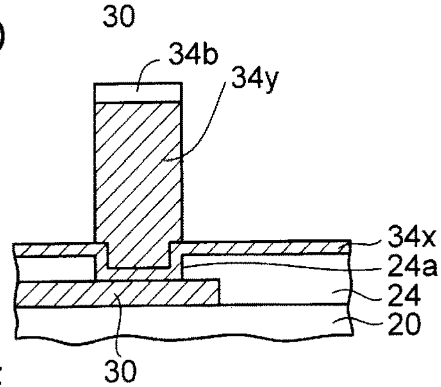
Figure 9E:
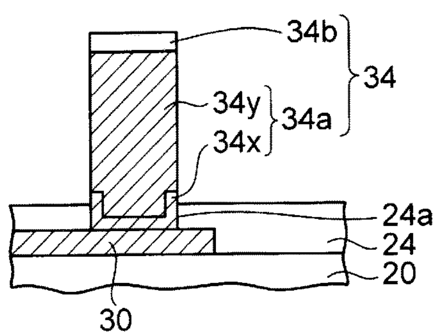

Subsequently, as shown in FIG. 9D, the plating resist layer 15 is removed. Furthermore, as shown in FIG. 9E, the seed layer 34*x* is removed by wet etching using the metal plated layer 34*y* as a mask. The pillar portion 34*a* of the metal pillar 34 includes the seed layer 34*x* and the metal plated layer 34*y*.

In the above-described manner, the metal pillars 34 shown in FIG. 8A are formed. It is noted that the seed layer 34*x* in FIG. 9E is not shown in FIG. 8A.

According to this exemplary embodiment, the metal pillars 34 are formed in the opening portions 15*a* of the plating resist layer 15 by electrolytic plating, so that the metal pillars 34 can be arranged at a narrower pitch as compared with a case where solder balls or the like are used.

For example, each metal pillar 34 is about 60 μm to about 100 μm in diameter and about 80 μm to about 160 μm in height. An arrangement pitch of the metal pillars 34 is about 100 μm.

Where it is not required to narrow the pitch of the connection terminals connecting the upper and lower wiring substrates, a solder ball or a cored solder ball having a conductor core such as a copper core may be used as the connection terminals.

Figure 8B:
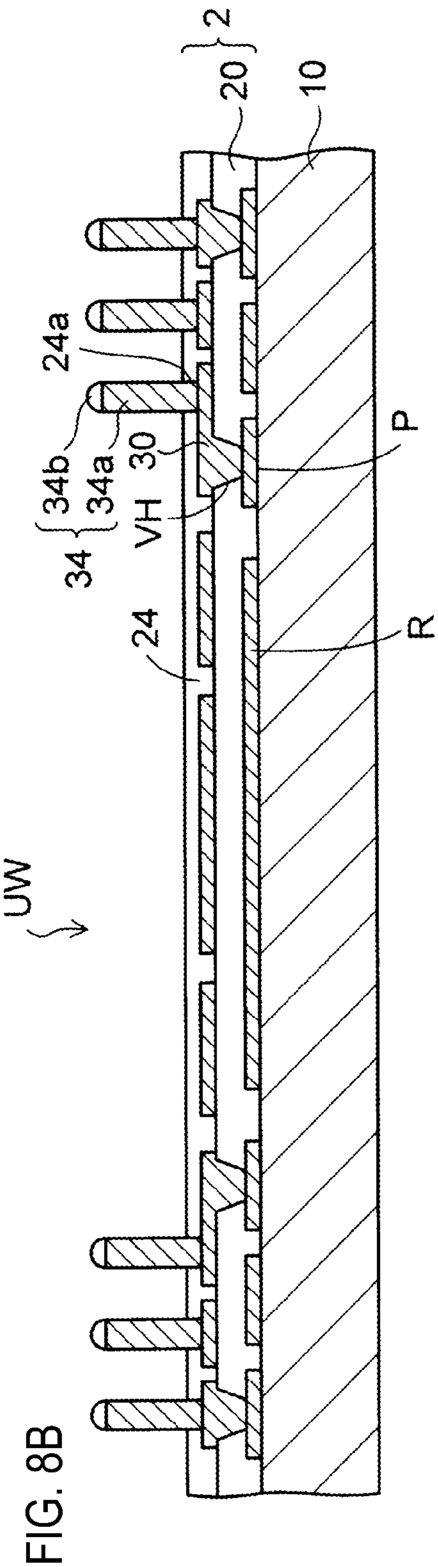

Furthermore, as shown in FIG. 8B, the solder layer 34*b* at the tip end of each metal pillar 34 is reflowed by heat treatment. Thereby, the upper surface side of each solder layer 34*b* is rounded to have a hemispherical shape.

In the above-described manner, an upper wiring member UW is obtained. In the upper wiring member UW, the upper coreless wiring substrate 2 including the metal pillars 34 is formed on the support body 10.

The method for forming the metal pillars 34 based on electrolytic plating is shown by way of example. Alternatively, metal pillar parts obtained by cutting a metal wire or the like may be aligned by a coordination fixture and joined to the pads P respectively by soldering or the like.

In this exemplary embodiment, as described above, the process of manufacturing the thin-film upper coreless wiring substrate 2 is carried out on the support body 10. Therefore, there is no fear that warpage may occur in the upper coreless wiring substrate 2.

Next, description will be given on a method for manufacturing a lower cored wiring substrate which is used as the lower wiring substrate of the electronic component device according to this exemplary embodiment.

Figure 10A:
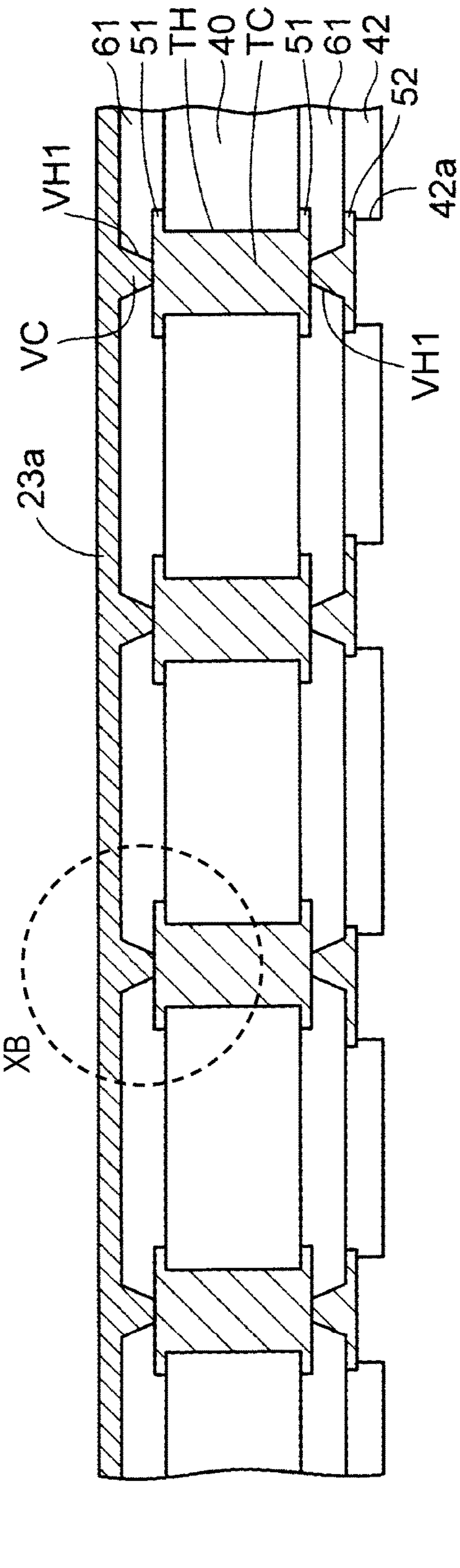
FIG. 10A is a sectional view (part 8) showing the manufacturing method according to the first exemplary embodiment.

First, the manufacturing method will be described up to a state where a structure shown in FIG. 10A is obtained. A core layer 40 is prepared. The core layer 40 is formed of fiber reinforcing material containing resin, such as glass epoxy resin or bismaleimide triazine resin, which is obtained by impregnating a fiber reinforcing material such as woven or nonwoven fabric with resin. Examples of the fiber reinforcing material provided in the core layer 40 include aramid fiber, carbon fiber and glass fiber.

The core layer 40 has, for example, 80 μm to 200 μm in thickness. The thickness of the core layer 40 is larger than that (for example, 30 μm) of the insulating layer 20 which is one of the layers of the upper coreless wiring substrate 2 shown in FIG. 8B. It is preferable that the thickness of the core layer 40 be at least twice as large as that of the insulating layer 20 which is the one of the layers of the upper coreless wiring substrate 2, in order to secure rigidity.

The core layer 40 is formed of the fiber reinforcing material containing resin as a whole. In order to secure a certain degree of rigidity, the thickness of the core layer 40 is at least 80 μm.

There is a case where a thin-film fiber reinforcing material containing resin layer is formed in the insulating layer 20 of the upper coreless wiring substrate 2 shown in FIG. 8B in order to reinforce the strength thereof. However, this thin-film fiber reinforcing material containing resin layer is not a core layer but an auxiliary layer.

Next, through holes TH penetrating the core layer 40 in its thickness direction are formed in the core layer 40 by drilling or the like. Furthermore, first wiring layers 51 are formed on both surfaces of the core layer 40, respectively. The first wiring layers 51 on the both surfaces of the core layer 40 are connected to each other via through conductors TC formed in the through holes TH.

The through conductors TC and the first wiring layers 51 are formed based on photolithography and plating technology. The through conductors TC and the first wiring layers 51 are made of copper or the like. Each wiring layer 51 has, for example, about 10 μm to about 20 μm in thickness.

The through conductors TC formed in the core layer 40 may be formed by filling the through holes TH with a copper plated layer or the like. In this case, laser machining is carried out on the both surface sides of the core layer 40 so as to form the through holes TH. A diameter of a central portion, in the thickness direction of the core layer 40, of each through hole TH is smaller than those of opening ends on the front and back surfaces of the core layer 40. A copper layer is filled into the through holes TH by electrolytic plating to thereby form the through conductors TC.

Alternatively, each through conductor TC may be a through hole plating layer formed on a side wall of each through hole TH. In this case, other parts of the through hole TH is filled with resin.

Each through hole TH formed in the core layer 40 extends straightly in the vertical direction. On the other hand, each via hole VH formed in the insulating layer 20 of the upper coreless wiring substrate 2 shown in FIG. 8B has the tapered shape differently from the core layer 40.

In this manner, the core layer 40 is different from the thin-film insulating layer of the coreless substrate in that the core layer 40 is formed of the fiber reinforcing material containing resin layer having at least 80 μm thick and provided with the straight through holes TH.

Next, first insulating layers 61 are formed on the respective surface sides of the core layer 40. First via holes VH1 are formed in the first insulating layers 61 and on connection portions of the first wiring layers 51. The first insulating layers 61 have, for example, about 20 μm to about 35 μm in thickness.

Each first insulating layer 61 is formed in such a manner that an uncured resin film is pasted and cured by heat treatment. For example, non-photosensitive thermosetting insulating resin is used as the resin film. Examples of such insulating resin include epoxy resin, polyimide resin, etc. Also, the first via holes VH1 are formed by laser machining in the first insulating layers 61.

Subsequently, a metal layer 23*a* is formed like a blanket all over the first insulating layer 61 on the upper surface side of the core layer 40. The metal layer 23*a* is connected to the first wiring layer 51 through the via conductors VC in the first via holes VH1.

More specifically, a seed layer made of copper or the like is formed on the first insulating layer 61 and inner surfaces of the via holes VH1 by an electroless plating method or a sputtering method. After that, a metal plated layer or the like is formed by electrolytic plating using the seed layer as a power supply path. Thereby, the metal layer 23*a* is obtained. The metal layer 23*a* has, for example, set at about 10 μm to about 20 μm in thickness.

Furthermore, at the same time, a second wiring layer 52 is formed on the first insulating layer 61 on the lower surface side of the core layer 40. The second wiring layer 52 is connected to the first wiring layer 51 through the via conductors VC in the first via holes VH1. The second wiring layer 52 is formed by a similar method to the semi-additive method which has been described with reference to FIGS. 7A to 7D. The second wiring layer 52 has, for example, about 10 μm to about 20 μm in thickness. Also, L/S (line (width) and space (interval)) of the second wiring layer 52 is about 16 μm/16 μm.

Next, a solder resist layer 42 is formed on the first insulating layer 61 on the lower surface side of the core layer 40. Opening portions 42*a* are formed in the solder resist layer 42 and on the connection portions of the second wiring layer 52. The solder resist layer 42 has, for example, about 20 μm to about 40 μm in thickness.

Photosensitive insulating resin including epoxy acrylate resin, phenol resin, polyimide resin or the like is used as the solder resist layer 42.

Figure 10B:
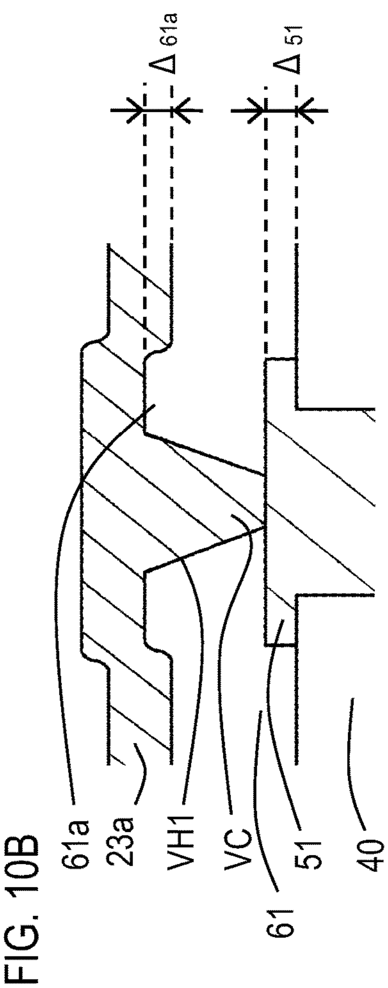
FIG. 10B is an enlarged view of a portion XB in FIG. 10A.

FIG. 10B is an enlarged view of a portion XB in FIG. 10A. As described above, the thickness ($\Delta_{51}$) of the wiring layer 51 on the upper side of the core layer 40 is in a range of about 10 μm to about 20 μm. In other words, the wiring layer 51 serves as step portions on the core layer 40. In the processes subsequent to the forming of the wiring layer 51, the step portions are transferred to the first insulating layer 61 and the metal layer 23*a* to some extent as shown in FIG. 10B. Specifically, step portions 61*a* are formed on the insulating layer 61 (which will be referred to as "global step portions 61*a*"). A thickness ($\Delta_{61a}$) of the global step portions 61 is about 5 μm.

Figure 11:
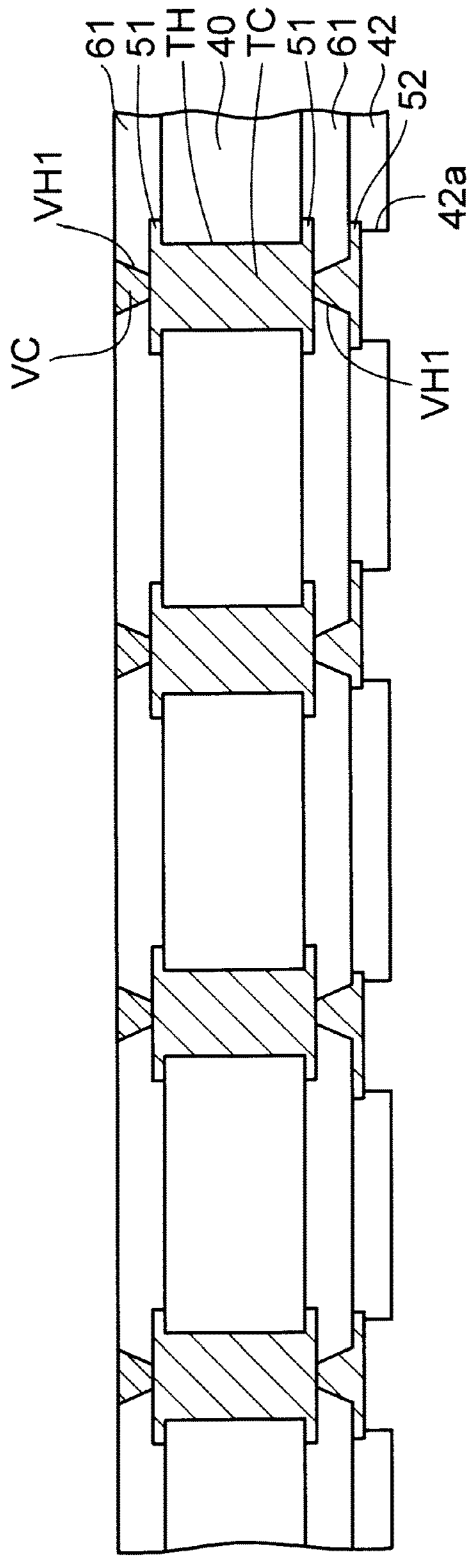
FIG. 11 is a sectional view (part 9) showing the manufacturing method according to the first exemplary embodiment.

Next, as shown in FIG. 11, the metal layer 23*a* on the upper surface side is polished to expose the first insulating layer 61 by CMP (Chemical Mechanical Polishing). An upper surface of the first insulating layer 61 is further polished to be flattened.

Thus, the global step portions 61*a* of the first insulating layer 61 which are formed due to transfer of the step portions (first wiring layer) 51 are removed. The upper surface of the first insulating layer 61 becomes a flat surface.

The via conductors VC are left as via electrodes in the first via holes VH1 of the first insulating layer 61. As a result, the upper surfaces of the via conductors VC are flush with the upper surface of the first insulating layer 61 and flattened.

In this manner, the metal layer 23*a* formed on the upper surface side of the core layer 40 is formed for the purpose of flattening the underlayer (insulating layer 61 and the via conductors VC), and is removed by polishing. A surface roughness of the flattened upper surface of the first insulating layer 61 is lower than that of the inner surface of each first via hole VH1. The surface roughness (Ra) of the upper surface of the first insulating layer 61 which has not been flattened is in a range of 300 nm to 400 nm, while the surface roughness (Ra) of the flattened upper surface of the first insulating layer 61 is in a range of 15 nm to 40 nm.

Figure 12:
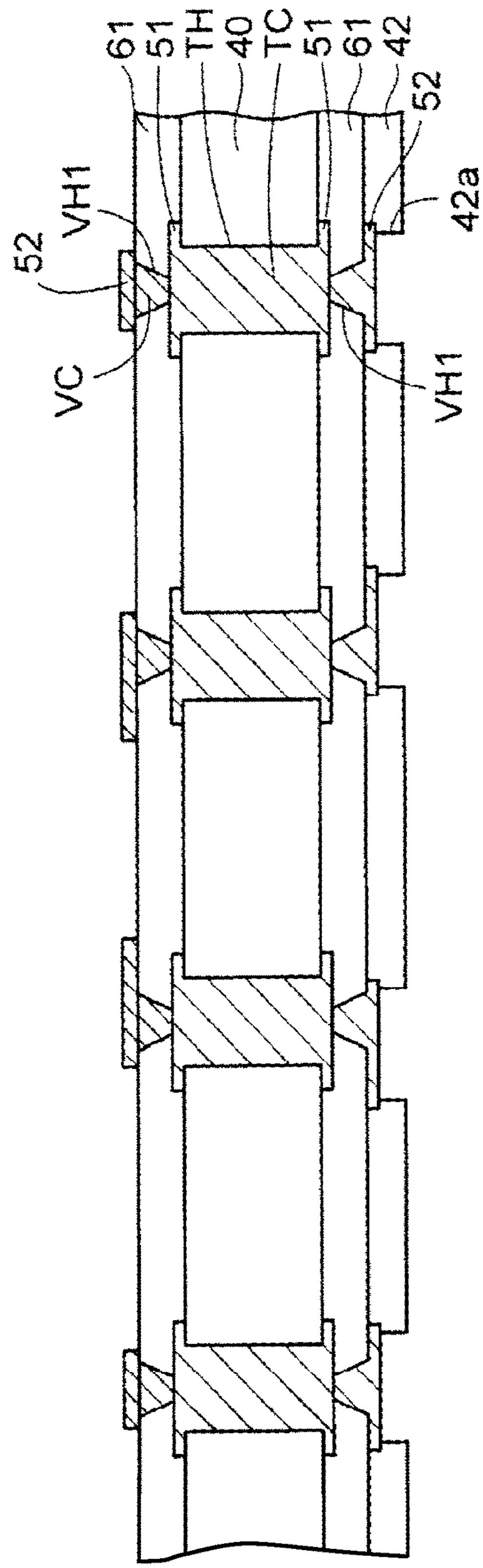
FIG. 12 is a sectional view (part 10) showing the manufacturing method according to the first exemplary embodiment.

Next, as shown in FIG. 12, a second wiring layer 52 is formed on the first insulating layer 61 on the upper surface side of the core layer 40. The second wiring layer 52 is connected to the via conductors VC. The second wiring layer 52 is formed in a similar method to the semi-additive method which has been described with reference to FIGS. 7A to 7D.

Specifically, at first, a titanium layer and a copper layer are formed on the first insulating layer 61 and the via conductors VC in order from bottom by a sputtering method, so as to form a seed layer. Then, a plating resist layer provided is formed on the seed layer. The plating resist layer is formed with opening portions at positions where the second wiring layer 52 will be provided.

Subsequently, a metal plated layer such as copper or the like is formed in each opening portion of the plating resist layer by electrolytic plating using the seed layer as a power supply path. Furthermore, the plating resist layer is removed, and the seed layer is then removed using the metal plated layer as a mask. As a result, the second wiring layer 52 is obtained. The second wiring layer 52 has, for example, 1 μm to 3 μm in thickness.

The upper surface of the first insulating layer 61 is flattened as described above. Therefore, the plating resist layer can be patterned minutely and accurately in the substrate even if the depth of focus in lithography is reduced when the minute pattern is formed.

As a result, the second wiring layer 52 having minute L/S (line (width) and space (interval)), for example, 2 μm/2 μm can be formed with good yield and meets design specifications. These are also true for third and fourth wiring layers and pads, which will be described later.

Figure 13:
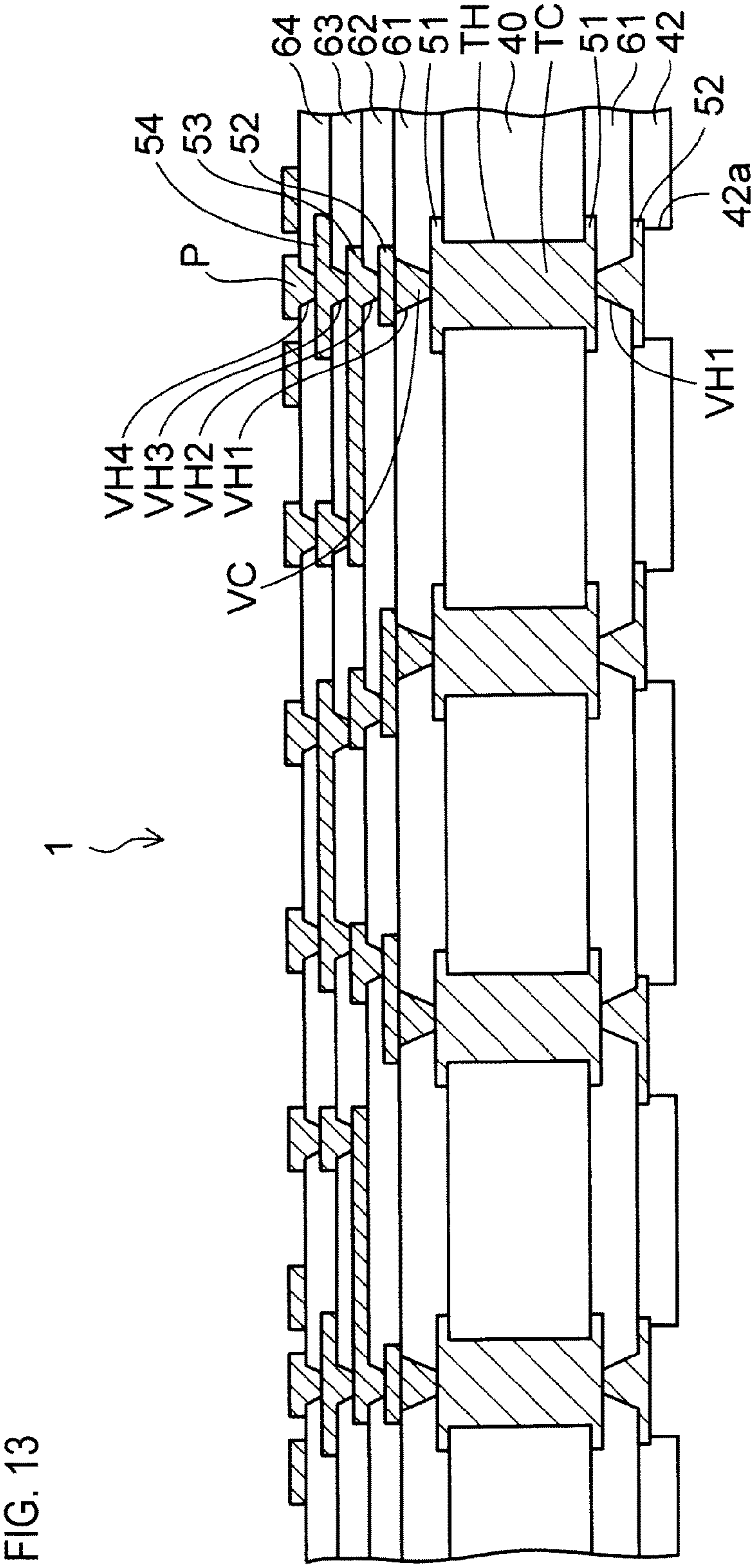
FIG. 13 is a sectional view (part 11) showing the manufacturing method according to the first exemplary embodiment.

Next, as shown in FIG. 13, photosensitive resin (not shown) is formed on the first insulating layer 61 and the second wiring layer 52 in FIG. 12. Then, exposure and development are carried out based on photolithography. After that, the photosensitive resin is cured by heat treatment. To form the photosensitive resin, liquid resin may be applied or a thin resin film may be pasted.

Thereby, a second insulating layer 62 is formed on the first insulating layer 61. Second via holes VH2 are provide in the second insulating layer 62 and on connection portions of the second wiring layer 52.

The photosensitive resin is patterned by photolithography so that a thin-film second insulating layer 62 formed with the minute second via holes VH2 is formed. The second insulating layer 62 has, for example, about 5 μm to about 10 μm in thickness.

Examples of the second insulating layer 62 include a permanent resist layer made of photosensitive phenol resin or polyimide resin. A similar resin material and a similar formation method may be used to form other insulating layers which will be described later.

Subsequently, a third wiring layer 53 is formed on the second insulating layer 62 by a similar method to the semi-additive method used to form the second wiring layer 52 on the upper surface side of the core layer 40. The third wiring layer 53 is connected to the second wiring layer 52 on the upper surface side of the core layer 40 through via conductors in the second via holes VH2.

Next, a third insulating layer 63 is formed on the second insulating layer 62 in the same manner as the second insulating layer 62 is formed. Third via holes VH3 are formed in the third insulating layer 63 and on connection portions of the third wiring layer 53.

Furthermore, in the same manner, a fourth wiring layer 54 is formed on the third insulating layer 63. The fourth wiring layer 54 is connected to the third wiring layer 53 through via conductors in the third via holes VH3.

Next, in the same manner, a fourth insulating layer 64 is formed on the third insulating layer 63. Fourth via holes VH4 are formed in the fourth insulating layer 64 and on connection portions of the fourth wiring layer 54.

Furthermore, in the same manner, pads P are formed on the fourth insulating layer 64. The pads P serve as a fifth wiring layer. The pads P are connected to the fourth wiring layer 54 through via conductors in the fourth via holes VH4. Each pad P may be arranged like an island or may be disposed at one end of lead-out wiring.

The second insulating layer 62, the third insulating layer 63 and the fourth insulating layer 64 are smaller in thickness than the first insulating layer 61. Also, the second wiring layer 52 on the upper surface side of the core layer 40, the third wiring layer 53 and the fourth wiring layer 54 are narrower in L/S (line (width) and space (interval)) than the first wiring layers 51 and the second wiring layer 52 on the lower surface side of the core layer 40.

Thus, the lower cored wiring substrate 1 for use in the electronic component device according to the first exemplary embodiment is obtained.

Figure 14:
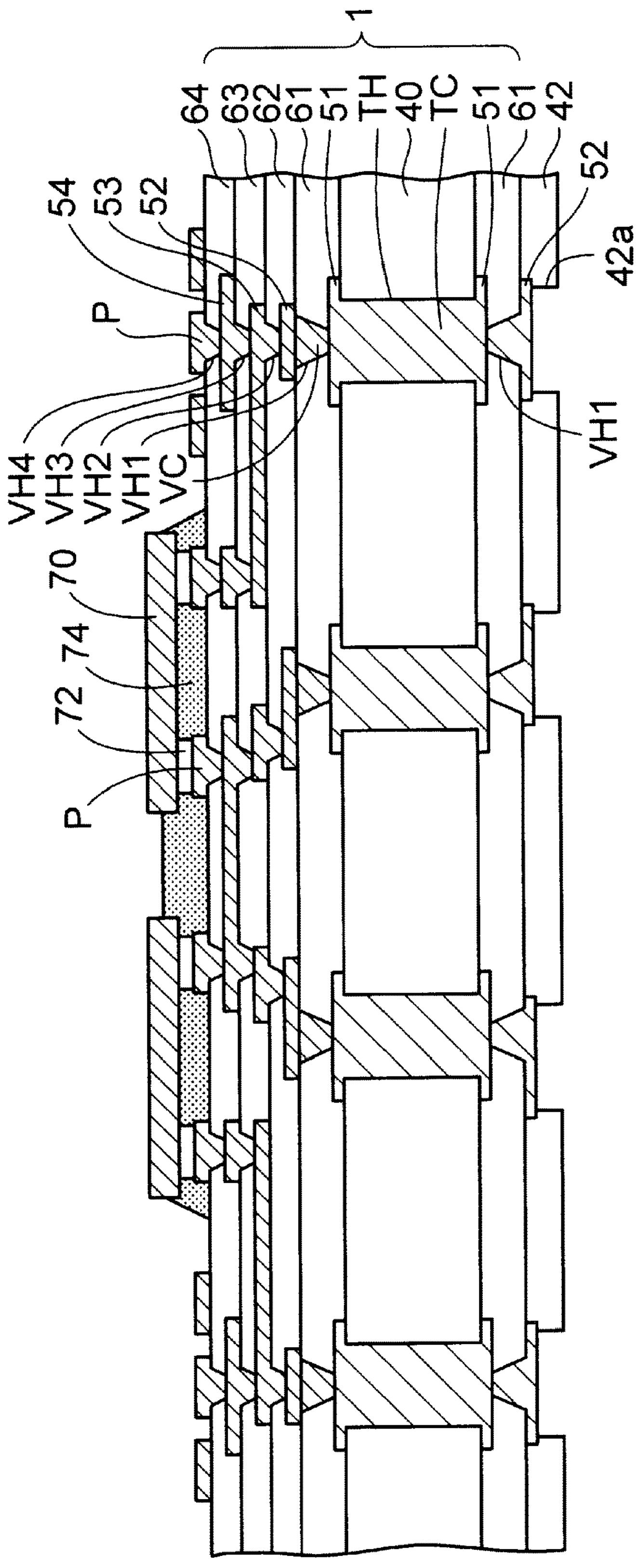
FIG. 14 is a sectional view (part 12) showing the manufacturing method according to the first exemplary embodiment.

Next, two semiconductor chips 70 are prepared as electronic components. As shown in FIG. 14, the semiconductor chips 70 are mounted in the central portion of the lower cored wiring substrate 1. Bump electrodes 72 of each semiconductor chip 70 are flip-chip connected to the pads P in the central portion of the lower cored wiring substrate 1.

After that, underfill resin 74 is filled into a gap between each semiconductor chip 70 and the lower cored wiring substrate 1.

Here, at the time of reflow-heating for flip-chip connection of each semiconductor chip 70, thermal stress occurs due to a difference in thermal expansion coefficient between the semiconductor chip 70 and the lower cored wiring substrate 1. Therefore, the lower cored wiring substrate 1 is convexly warped toward the chip mounting side.

In the example shown in FIG. 14, the semiconductor chips 70 are mounted as electronic components. However, various electronic components including capacitors, resistance elements, inductor elements, etc. may be mounted.

Next, description will be given on a method for stacking the upper wiring member UW shown in FIG. 8B on the lower cored wiring substrate 1 mounted with the semiconductor chips 70 shown in FIG. 14.

Figure 15:
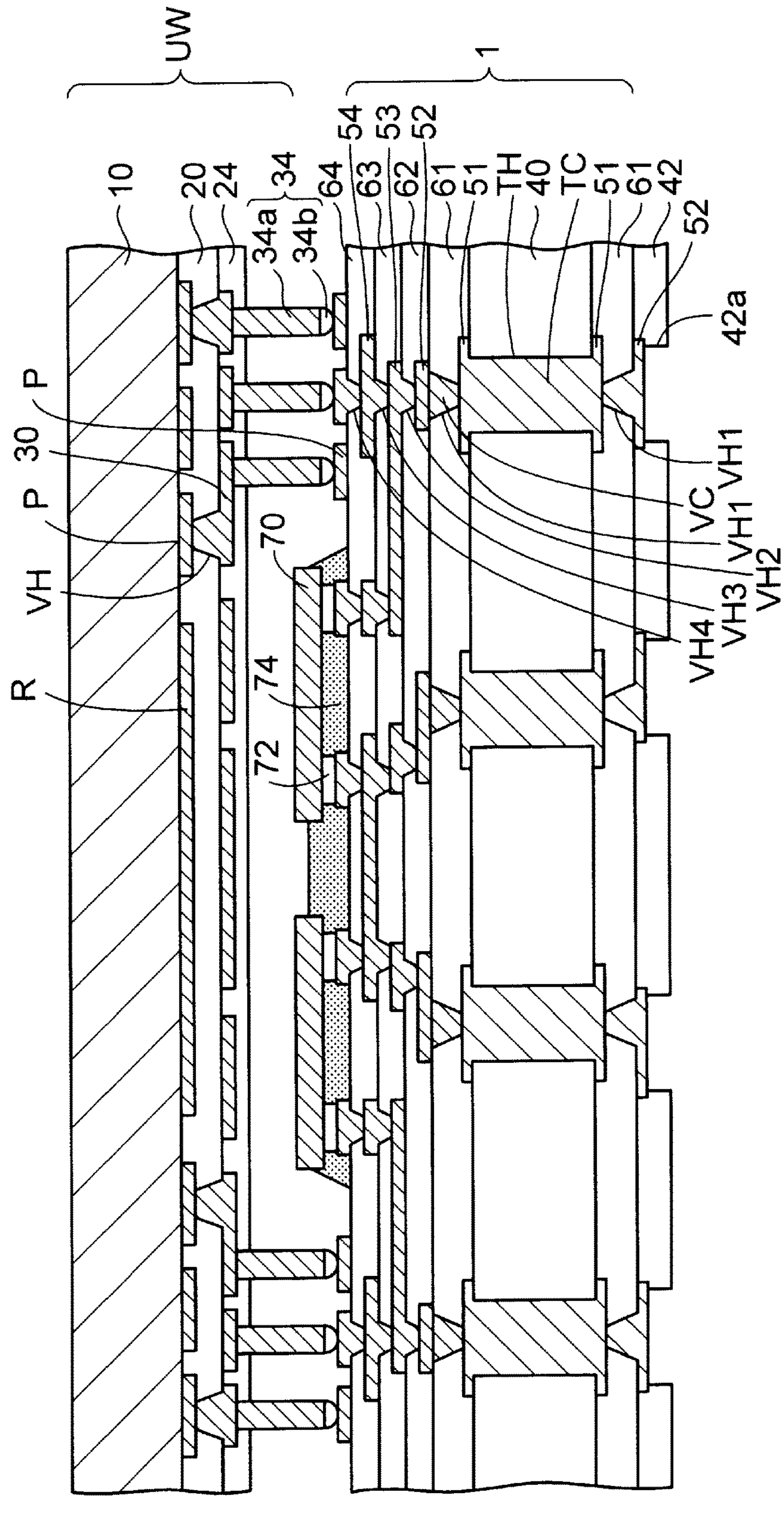
FIG. 15 is a sectional view (part 13) showing the manufacturing method according to the first exemplary embodiment.

As shown in FIG. 15, the upper wiring member UW is stacked on the lower cored wiring substrate 1 shown in FIG. 14 so that the solder layers **34*b* at the tip ends of the metal pillars 34 in the upper wiring member UW are disposed on the pads P on the circumferential portion of the lower cored wiring substrate 1**.

Figure 16:
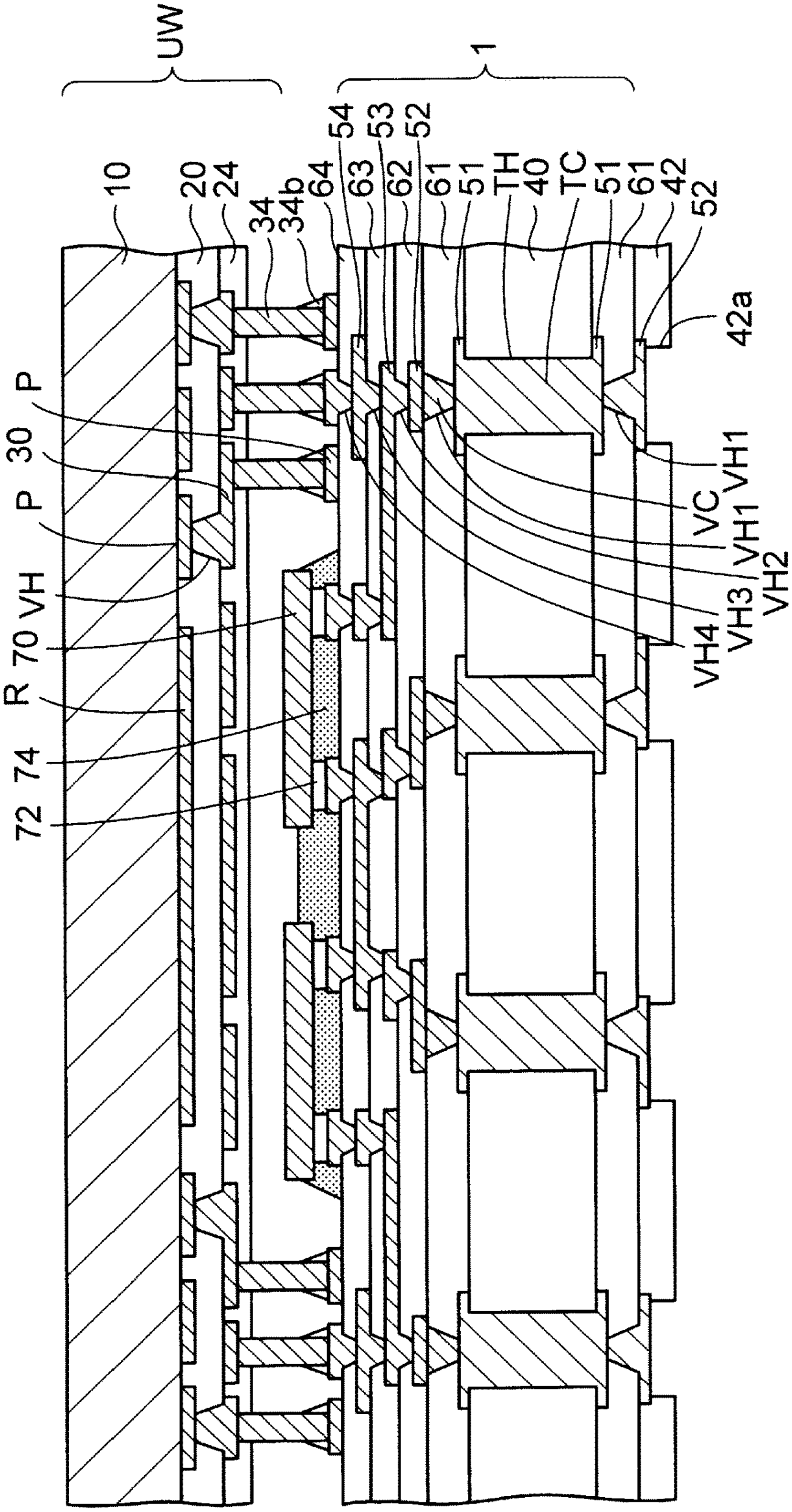
FIG. 16 is a sectional view (part 14) showing the manufacturing method according to the first exemplary embodiment.

Also, as shown in FIG. 16, heat treatment is carried out to reflow the solder layers **34*b* of the metal pillars 34. Thereby, the metal pillars 34 of the upper wiring member UW are joined to the pads P of the lower cored wiring substrate 1**.

Thus, a space is formed between the lower cored wiring substrate 1 and the upper wiring member UW by the metal pillars 34. Also, the semiconductor chips 70 are housed in the space.

Figure 17:
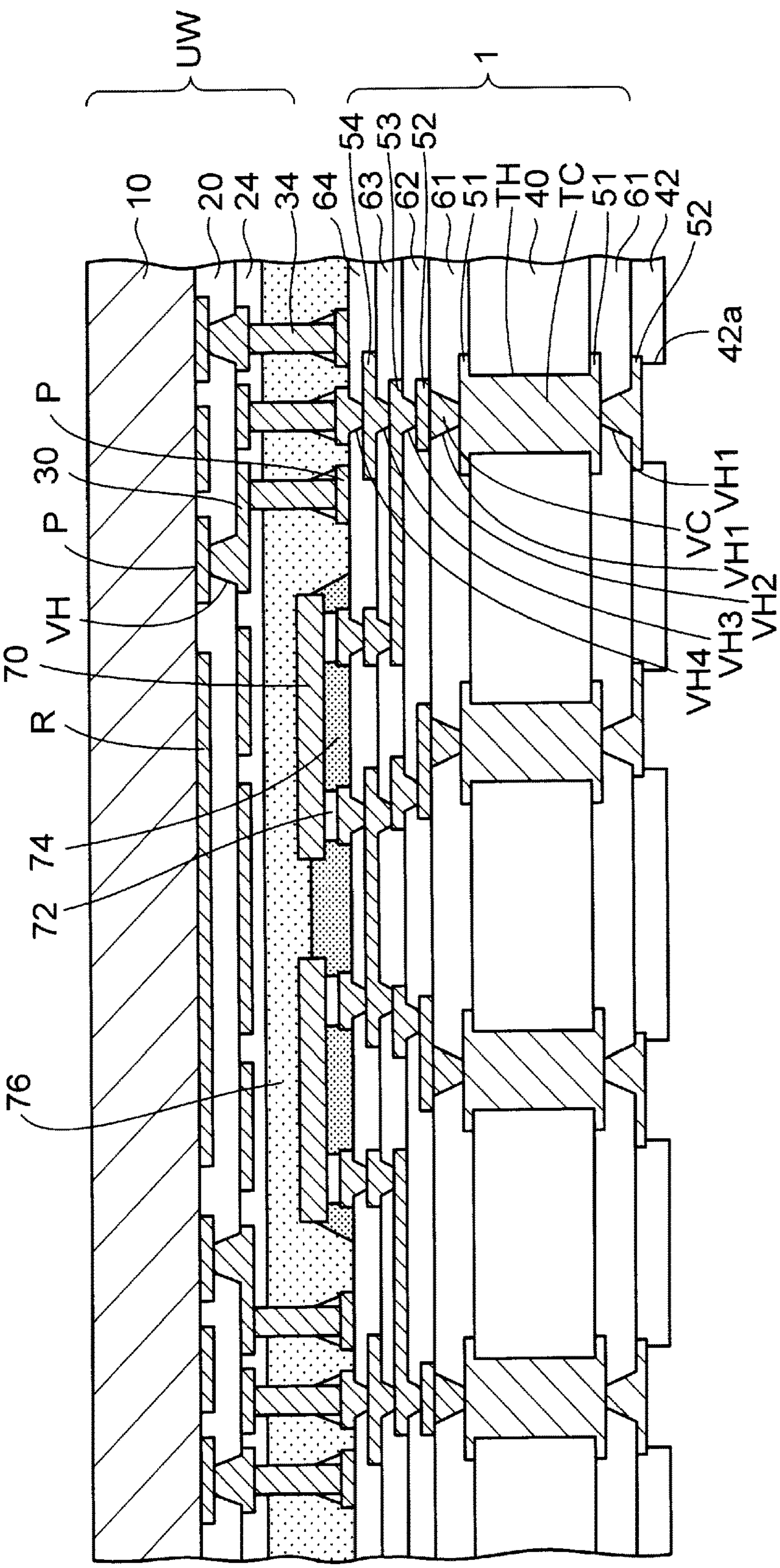
FIG. 17 is a sectional view (part 15) showing the manufacturing method according to the first exemplary embodiment.

Furthermore, as shown in FIG. 17, sealing resin 76 is filled between the lower cored wiring substrate 1 and the upper wiring member UW. The sealing resin 76 is, for example, made of epoxy resin. The sealing resin 76 is filled by transfer molding. Thereby, the semiconductor chips 70 are sealed with the sealing resin 76. A distance between (i) the lower surface of the upper coreless wiring substrate UW (specifically, the lower surface of the solder resist layer 24) and (ii) each semiconductor chip 70 is equal to or larger than 30 μm. If this distance is less than 30 μm, a failure in filling the sealing resin 76 into the gap between the lower cored wiring substrate 1 (particularly, each semiconductor chip 70) and the upper wiring member UW may occur. A distance between the reinforcing layer R and each semiconductor chip 70 is equal to or larger than 60 μm.

At this time, the convex warpage of the lower cored wiring substrate 1 is corrected by the support body 10 of the upper wiring member UW.

Figure 18:
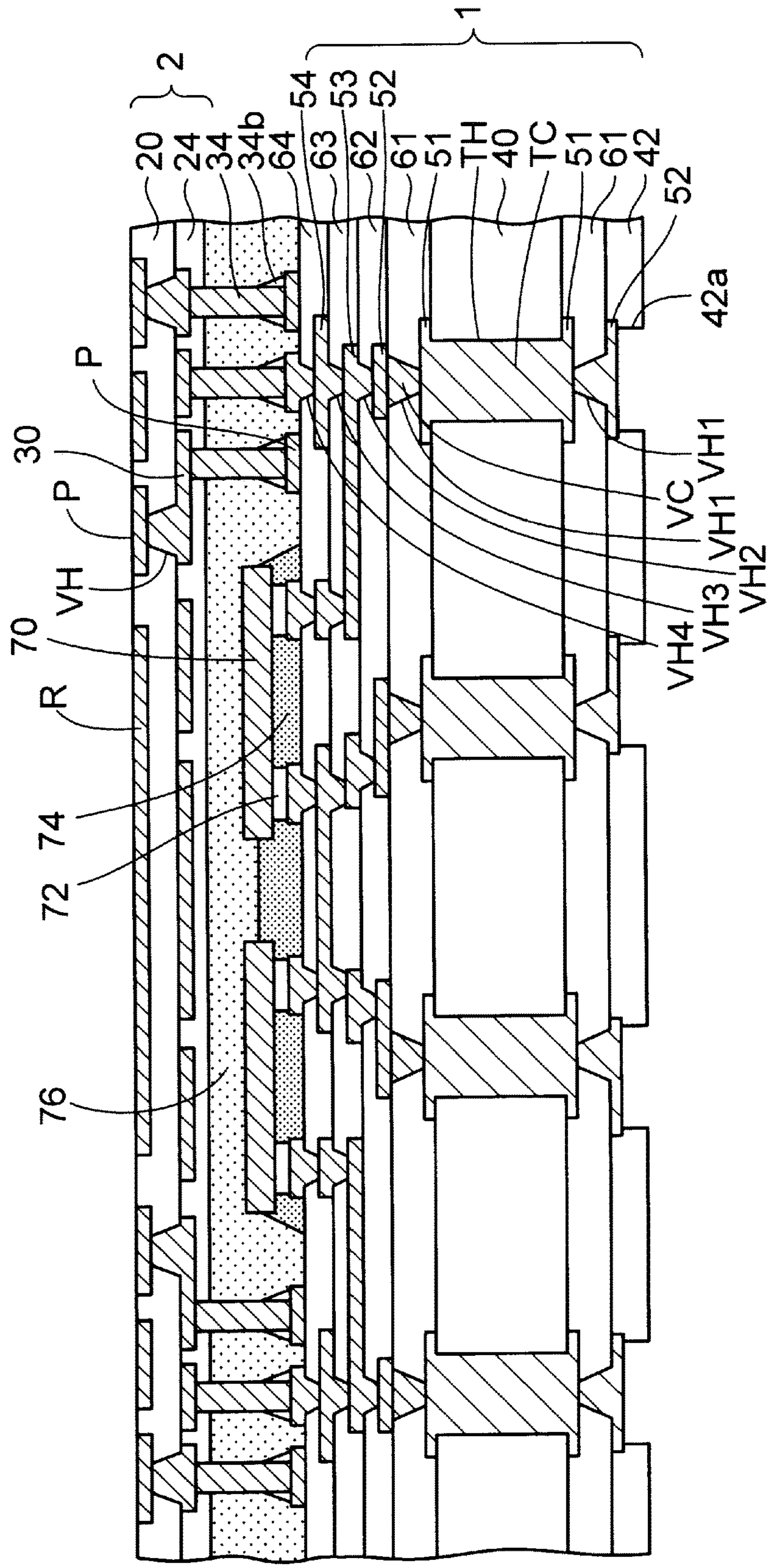
FIG. 18 is a sectional view (part 16) showing the manufacturing method according to the first exemplary embodiment.

After that, as shown in FIG. 18, the support body 10 is removed from the upper wiring member UW in FIG. 17 by wet etching. Where the support body 10 is made of copper, an alkali-based wet etchant is used. The alkali-based wet etchant selectively etches the support body 10 made of copper as compared with the gold layer and/or the nickel layer on the outermost side of each pad P and the insulating layer 20.

In this manner, the support body 10 is removed from the upper wiring member UW. The upper coreless wiring substrate 2 is left over.

Here, let consider a case where, unlike the first exemplary, no reinforcing layer R is formed on the upper surface side of the insulating layer 20 of the upper coreless wiring substrate 2. In this case, the upper coreless wiring substrate 2 from which the support body 10 has been removed is weak in rigidity. Therefore, the lower cored wiring substrate 1 is warped convexly again due to residual stress.

To the contrary, in the first exemplary embodiment, the upper coreless wiring substrate 2 includes the reinforcing layer R on the upper surface side thereof. It is, therefore, possible to cancel the stress which causes the convex warpage of the lower cored wiring substrate 1. As a result, the reinforcing layer R provides such an effect that the lower cored wiring substrate 1 is kept in a state where the warpage has been corrected, even after the support body 10 is removed from the upper wiring member UW.

Where a copper layer is formed on the outer surface side of the gold layer and/or the nickel layer of each pad P in advance as described above, the pad P is recessed from the outer surface of the insulating layer 20 toward an inner side of the insulating layer 20.

Figure 19:
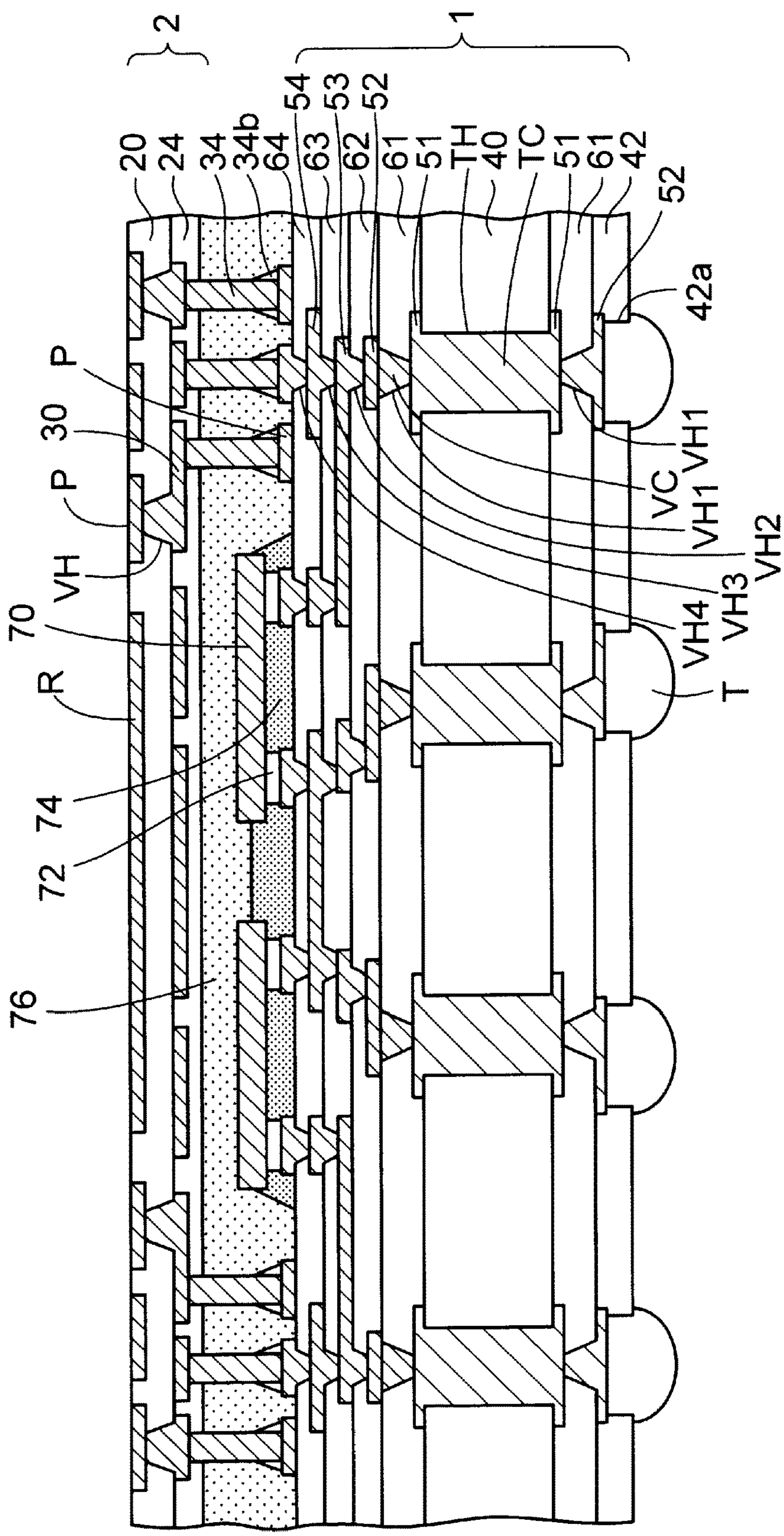
FIG. 19 is a sectional view (part 17) showing the manufacturing method according to the first exemplary embodiment.
Figure 20:
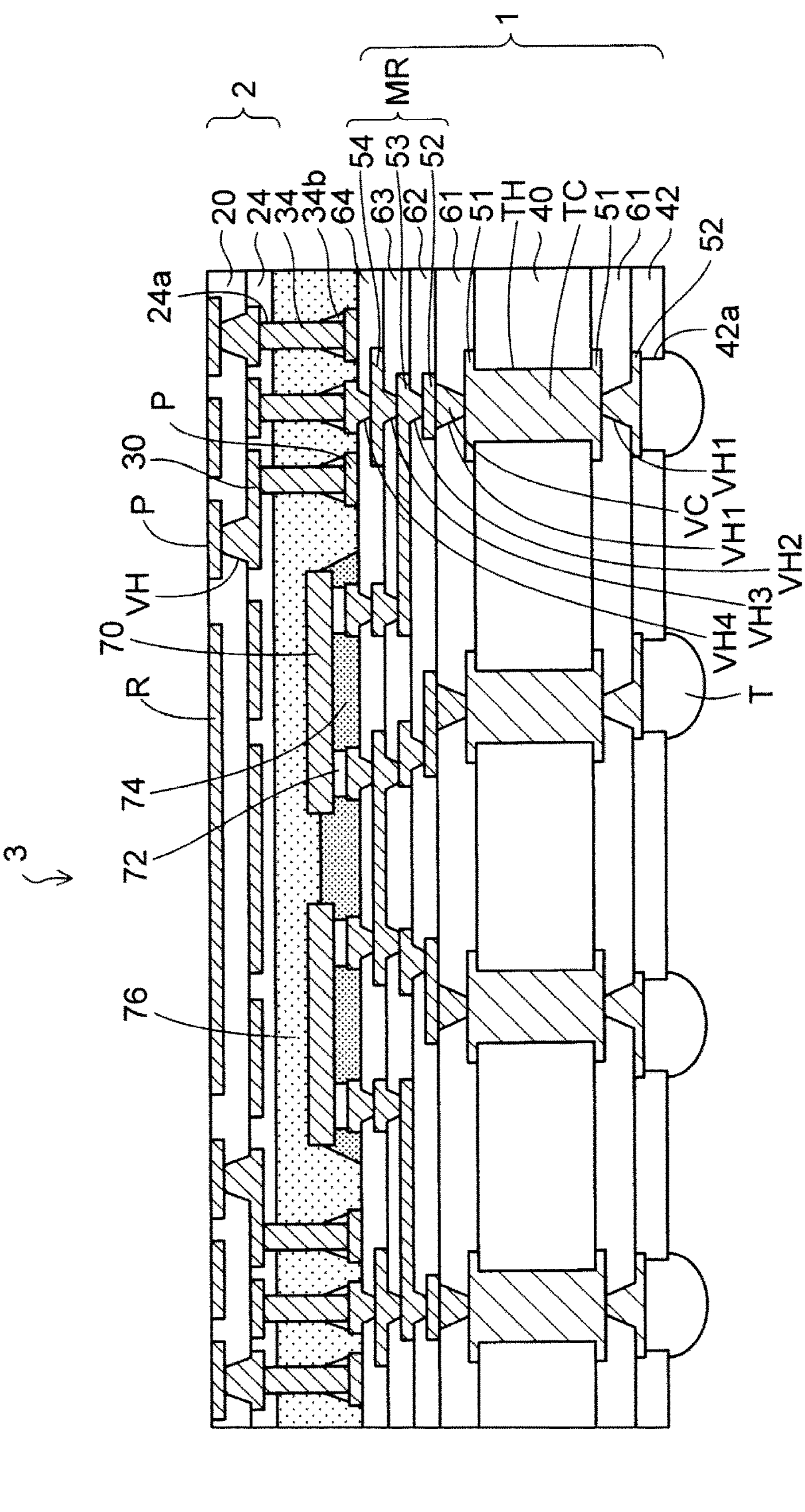
FIG. 20 is a sectional view showing the electronic component device according to the first exemplary embodiment.

Next, as shown in FIG. 19, external connection terminals T are formed. Specifically, solder balls are mounted on the second wiring layer 52 on the lower surface side of the lower cored wiring substrate 1.

It is assumed that as shown in FIG. 20, the lower cored wiring substrate 1 and the upper coreless wiring substrate 2 make up a large-sized substrate including a plurality of product regions. In this case, the lower cored wiring substrate 1 and the upper coreless wiring substrate 2 are cut off from the upper surface of the upper coreless wiring substrate 2 to the lower surface of the lower cored wiring substrate 1. Thereby, the large-sized substrate is separated into the respective product regions.

In the above described manner, the electronic component device 3 according to the first exemplary embodiment is obtained.

As shown in FIG. 20, the electronic component device 3 according to the first exemplary embodiment includes the lower cored wiring substrate 1 and the upper coreless wiring substrate 2. The lower cored wiring substrate 1 is mounted with the semiconductor chips 70. The upper coreless wiring substrate 2 is stacked on the lower cored wiring substrate 1 through the metal pillars 34. The semiconductor chips 70 are housed between the lower cored wiring substrate 1 and the upper coreless wiring substrate 2.

The lower cored wiring substrate 1 includes the core layer 40 internally in a thickness direction thereof. The first wiring layers 51 are formed on the both surface sides of the core layer 40, respectively. The through conductors TC are formed in the core layer 40. The first wiring layers 51 on the both surface sides are connected to each other through the through conductors TC.

The first insulating layers 61 are formed on the both surface sides of the core layer 40, respectively. The first via holes VH1 are formed in the first insulating layers and on the connection portions of the first wiring layers 51. The second wiring layer 52 is formed on the first insulating layer 61 on the lower surface side of the core layer 40. The second wiring layer 52 is connected to the first wiring layer 51 through the first via holes VH1.

Furthermore, the solder resist layer 42 is formed on the first insulating layer 61 on the lower surface side of the core layer 40. The solder resist layer 42 is formed with the opening portions 42*a* on the connection portions of the second wiring layer 52.

The external connection terminals T are formed on the second wiring layer 52 and in the opening portions 42*a* of the solder resist layer 42.

In addition, the first via holes VH1 of the first insulating layer 61 on the upper surface side of the core layer 40 are filled with the via conductors VC. The upper surface of the first insulating layer 61 on the upper surface side of the core layer 40 is polished and flattened. The upper surface of the first insulating layer 61 is flush with the upper surfaces of the via conductors VC.

The second wiring layer 52 is formed on the first insulating layer 61 on the upper surface side of the core layer 40. The second wiring layer 52 is connected to the via conductors VC.

Furthermore, a minute multilayer wiring layer MR is formed on the flattened first insulating layer 61. The minute multilayer wiring layer MR is connected to the second wiring layer 52. In the multilayer wiring layer MR, the second wiring layer 52, the second insulating layer 62, the third wiring layer 53, the third insulating layer 63, the fourth wiring layer 54, the fourth insulating layer 64 and the pads P are stacked in order.

The second wiring layer 52 is connected to the third wiring layer 53 through the second via holes VH2 formed in the second insulating layer 62. In addition, the third wiring layer 53 is connected to the fourth wiring layer 54 through the third via holes VH3 formed in the third insulating layer 63. Furthermore, the fourth wiring layer 54 is connected to the pads P through the fourth via holes VH4 formed in the fourth insulating layer 64.

Since the multilayer wiring layer MR is formed on the flattened first insulating layer 61 as described above, a wiring pitch of the multilayer wiring layer MR narrower than that of the first wiring layer 51.

The lower cored wiring substrate 1 is built up in the above described manner. The bump electrodes 72 of the two semiconductor chips 70 are flip-chip connected to the pads P in the central portion of the lower cored wiring substrate 1. Furthermore, the underfill resin 74 is filled under the semiconductor chips 70.

When a total thickness of the minute multilayer wiring layer MR is as large as the thickness of the solder resist layer 42 or equal to or less than the thickness of the solder resist layer 42, the warpage of the lower cored wiring substrate 1 itself can be reduced.

This is because the volumes of the insulating layers and solder resist layer and the volumes of the wiring layers are balanced between the upper and lower sides of the core layer 40.

The upper coreless wiring substrate 2 stacked on the lower cored wiring substrate 1 has no core layer. The upper coreless wiring substrate 2 includes the thin-film insulating layer 20 as its base. Also, the reinforcing layer R is formed in the central portion of the insulating layer 20 on the upper surface side (outer surface side) thereof. In addition, the plurality of pads P are arranged in the region around the reinforcing layer R on the upper surface of the insulating layer 20.

The reinforcing layer R is at the same height as the pads P (wiring layer). The side surface and the lower surface of the reinforcing layer R are embedded in the insulating layer 20. The upper surface of the reinforcing layer R is exposed from the insulating layer 20. This is because the support body 10 is removed from the upper wiring member UW where the upper coreless wiring substrate 2 has been formed on the support body 10 and because the upper coreless wiring substrate 2 is disposed upside down, as described previously.

Also, the reinforcing layer R may be electrically independent from the other electrical conductive members such as the wiring layers and the pads.

The via holes VH are formed in the insulating layer 20. The via holes VH reach the pads P. Each via hole VH has an inverted tapered shape whose diameter increases from top to bottom. This is because laser machining is carried out from the upper surface of the insulating layer 20 on the pads P to thereby form the via holes and because the via holes thus formed are disposed upside down.

Each of the first to fourth via holes VH1 to VH4 of the lower cored wiring substrate 1 has the tapered shape whose diameter decreases from top to bottom. The shape of each of the first to fourth via holes VH1 to VH4 is reverse to the shape of each via hole VH of the upper coreless wiring substrate 2.

In addition, the wiring layer 30 is formed on the lower surface of the insulating layer 20. The wiring layer 30 is connected to the pads P through the via conductors in the via holes VH. The side surface and the lower surface of the wiring layer 30 are exposed from the insulating layer 20.

In addition, the solder resist layer 24 is formed on the lower surface of the insulating layer 20. The opening portions 24*a* are formed in the solder resist layer 24 and on the connection portions of the wiring layer 30. The metal pillars 34 are formed in the opening portions 24*a* of the solder resist layer 24. The metal pillars 34 are connected to the wiring layer 20.

The tip ends of the metal pillars 34 formed in the upper coreless wiring substrate 2 are joined to the pads P on the circumferential portion of the lower cored wiring substrate 1, by the solder layers 34*b*.

In this manner, the insulating layer 20, the wiring layer 30 and the pads P are stacked in the upper coreless wiring substrate 2. Each of the via conductors formed in the via holes VH of the insulating layer 20 has the truncated cone shape whose diameter is smaller on the external side of the electronic component device 3 than on the internal side of the electronic component device 3.

Furthermore, the sealing resin 76 is filled between the lower cored wiring substrate 1 and the upper coreless wiring substrate 2. The semiconductor chips 70 are sealed with the sealing resin 76.

In the electronic component device 3 according to the first exemplary embodiment, the lower cored wiring substrate 1 mounted with the semiconductor chips 70 has the residual stress. The residual stress acts on the lower cored wiring substrate 1 to warp the lower cored wiring substrate 1 into a convex shape. In addition, the reinforcing layer R is formed on the upper surface side of the insulating layer 20 in the upper coreless wiring substrate 2.

In the first exemplary embodiment, the residual stress that acts on the lower cored wiring substrate 1 to warp the lower cored wiring substrate 1 into the convex shape can be canceled by the effect of the reinforcing layer R of the upper coreless wiring substrate 2 as described with reference to the simulation results of FIGS. 2A and 2B. Thus, occurrence of the warpage of the electronic component device 3 can be suppressed.

As described with reference to the simulation results of FIGS. 2A and 2B, the reinforcing layer R is provided on the upper surface side of the insulating layer 20 of the upper coreless wiring substrate 2. The reinforcing layer R is located at a certain distance from each semiconductor chip 70 mounted on the lower cored wiring substrate 1. The certain distance is, for example, 60 μm or more.

In addition, the reinforcing layer R is disposed in the region corresponding to each semiconductor chip 70. The area of the reinforcing layer R may be slightly smaller than that of the semiconductor chip 70. Alternatively, the area of the reinforcing layer R may be larger than that of the semiconductor chip 70. Preferably, the area of the reinforcing layer R is about 0.8 times to about 2 times as large as that of the semiconductor chip 70.

When a plurality of semiconductor chips 70 are mounted as shown in FIG. 20, a collective region where the semiconductor chips 70 are disposed may be regarded as the area of the semiconductor chips 70.

The reinforcing layer R is disposed so as to overlap, in planar view, the region in which the semiconductor chips 70 are mounted.

The total thickness of the upper coreless wiring substrate 2 may be smaller than that of the core layer 40 of the lower cored wiring substrate 1. Even in this case, occurrence of warpage of the electronic component device 3 can be suppressed because the reinforcing layer R is provided.

Also, in the electronic component device 3 according to the first exemplary embodiment, the upper wiring substrate is the coreless substrate. It is, therefore, possible to reduce the thickness of the electronic component device 3. In addition, the metal pillars 34 may be arranged with a narrower pitch in accordance with the configuration that the higher density mounting of the high performance semiconductor chips 70 are mounted highly densely. It is, therefore, possible to reduce the size of the electronic component device 3.

For example, the thickness of the lower cored wiring substrate 1 excluding the connection terminals T is in a range of about 200 μm to about 250 μm. The thickness of the upper coreless wiring substrate 2 excluding the metal pillars 34 is in a range of 70 μm to 100 μm. Since the upper wiring substrate is configured by the coreless substrate as described above, the thickness of the upper wiring substrate can be made significantly thinner than in the case where a cored substrate is used as the upper wiring substrate.

Figure 21:
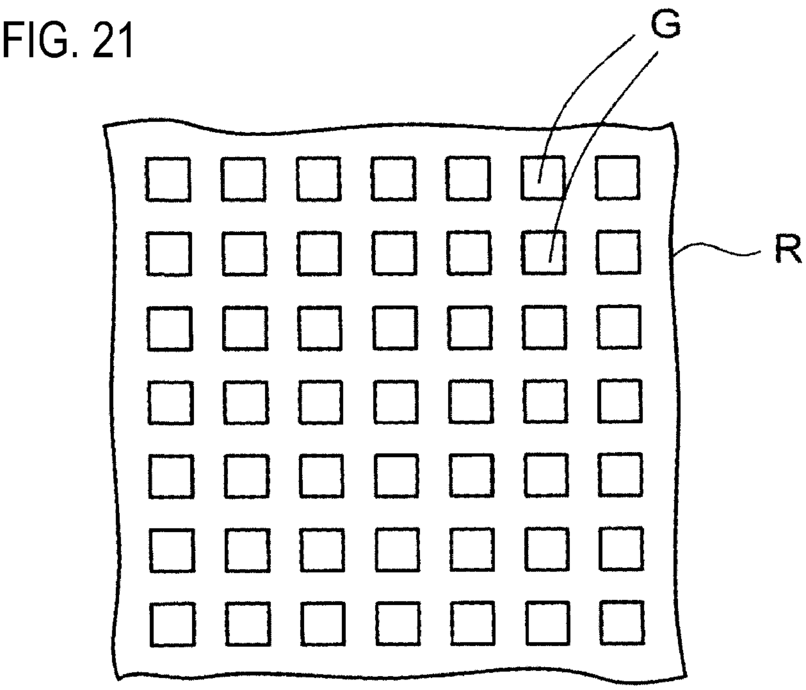
FIG. 21 is a partial plan view showing a modification example of a reinforcing layer in the electronic component device according to the first exemplary embodiment.

The reinforcing layer R may not have the collective square pattern as shown in FIG. 1B (reduced plan view), but may be formed with a plurality of degassing holes G in the collective pattern as shown in a partial plan view of FIG. 21. The square degassing holes G of the reinforcing layer R are filled with the same resin as the insulating layer 20. The degassing holes G penetrate through the reinforcing layer R in the thickness direction thereof. In the example of FIG. 21, the reinforcing layer R is formed like a lattice due to the spare degassing holes G. Alternatively, the reinforcing layer R may be formed in various shapes such as a circle, a hexagon, etc.

Thus, even if gas is generated in the electronic component device 3 by various heat treatments, there is no fear that gas staying under the reinforcing layer R may expand the reinforcing layer R. It is, therefore, possible to prevent occurrence of interlayer peeling or the like.

Also, a rigidity that the reinforcing layer R provides can be adjusted by forming the degassing holes G in the reinforcing layer R. Thus, the reinforcing layer R well keeps the lower cored wiring substrate 1 be in a state where the warpage of the lower cored wiring substrate 1 is corrected.

As described above, the electronic component device 3 according to the first exemplary embodiment is provided with the lower cored wiring substrate 1 and the upper coreless wiring substrate 2. The lower cored wiring substrate 1 includes the multilayer wiring layer MR. The multilayer wiring layer MR is formed on the flattened first insulating layer 61. Thus, L/S (line (width) and space (interval)) of the multilayer wiring layer MR can be made narrower than that of a typical wiring substrate having a core layer.

As a result, (i) the metal pillars 34 and (ii) the pads P for connecting the semiconductor chips 70 can be disposed in the multilayer wiring layer MR with high density. Thus, the planar size of the lower cored wiring substrate 1 can be reduced.

Similarly, the insulating layers and the wiring layers are stacked on the flattened support body 10 in manufacturing the upper coreless wiring substrate 2. It is, therefore, possible to make L/S (line (width) and space (interval)) of the wiring layer narrower than that of a typical wiring substrate with a core layer.

As a result, (i) the metal pillars 34 and (ii) the pads for connecting the semiconductor chips 70 can be disposed in the upper coreless wiring substrate 2 with high density. It is, therefore, possible to reduce the planar size of the upper coreless wiring substrate 2. Furthermore, the upper coreless wiring substrate 2 has no core layer. It is, therefore, possible to make the wiring substrate 2 thinner.

Furthermore, the metal pillars 34 whose pitch can be made narrower than that of solder balls are used as connection terminals for connecting the lower cored wiring substrate 1 and the upper coreless wiring substrate 2.

In this manner, the electronic component device 3 according to the first exemplary embodiment uses the above described wiring substrate and the connection terminals. It is, therefore, possible to further reduce the size and thickness of the electronic component device 3.

Figure 22:
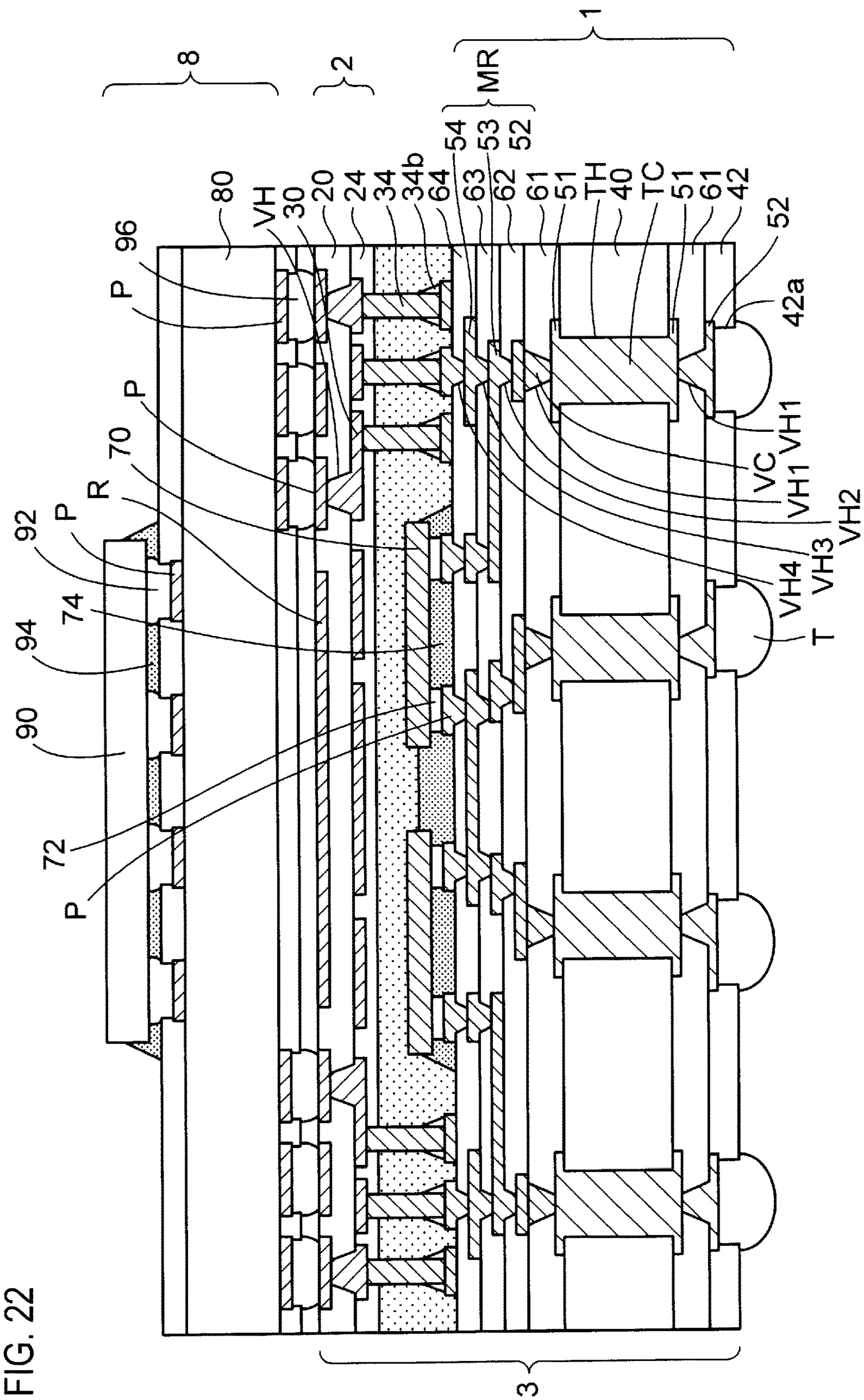
FIG. 22 is a sectional view showing a state in which another semiconductor package is stacked on the electronic component device in FIG. 20.

FIG. 22 shows a usage example of the electronic component device 3 according to the first exemplary embodiment. As shown in FIG. 22, another semiconductor package 8 is provided. In the semiconductor package 8, bump electrodes 92 of a semiconductor chip 90 are flip-chip connected to pads P formed on an upper surface of a wiring substrate 80. Underfill resin 94 is filled between the semiconductor chip 90 and the wiring substrate 80.

Pads P on a lower surface of the wiring substrate 80 of the semiconductor package 8 are connected to the pads P on the upper surface side of an upper coreless wiring substrate 2 of the electronic component device 3 through solder electrodes 96.

For example, semiconductor chips 70 of the electronic component device 3 are logic chips such as CPUs, and the semiconductor chip 90 of the semiconductor package 8 is a memory chip such as a DRAM.

Furthermore, the external connection terminals T of the lower cored wiring substrate 1 are connected to connection electrodes (not shown) of a mounting board such as a mother board.

The warpage of the electronic component device 3 can be suppressed. Thus, the other semiconductor package 8 can be connected onto the electronic component device 3 with high reliability. For the same reason, the external connection terminals T of the electronic component device 3 can be connected to the mounting board with high reliability.

In the example of FIG. 22, the other semiconductor package 8 is mounted on the electronic component device 3. Alternatively, various electronic components such as semiconductor chips, chip capacitors, inductors, resistors, etc. may be mounted on the electronic component device 3.

For example, in a case where a semiconductor chip is mounted on the electronic component device 3, electrodes of the semiconductor chip are flip-chip connected to the pads P of the upper coreless wiring substrate 2, and underfill resin is filled between the semiconductor chip and the insulating layer 20.

Figure 23:
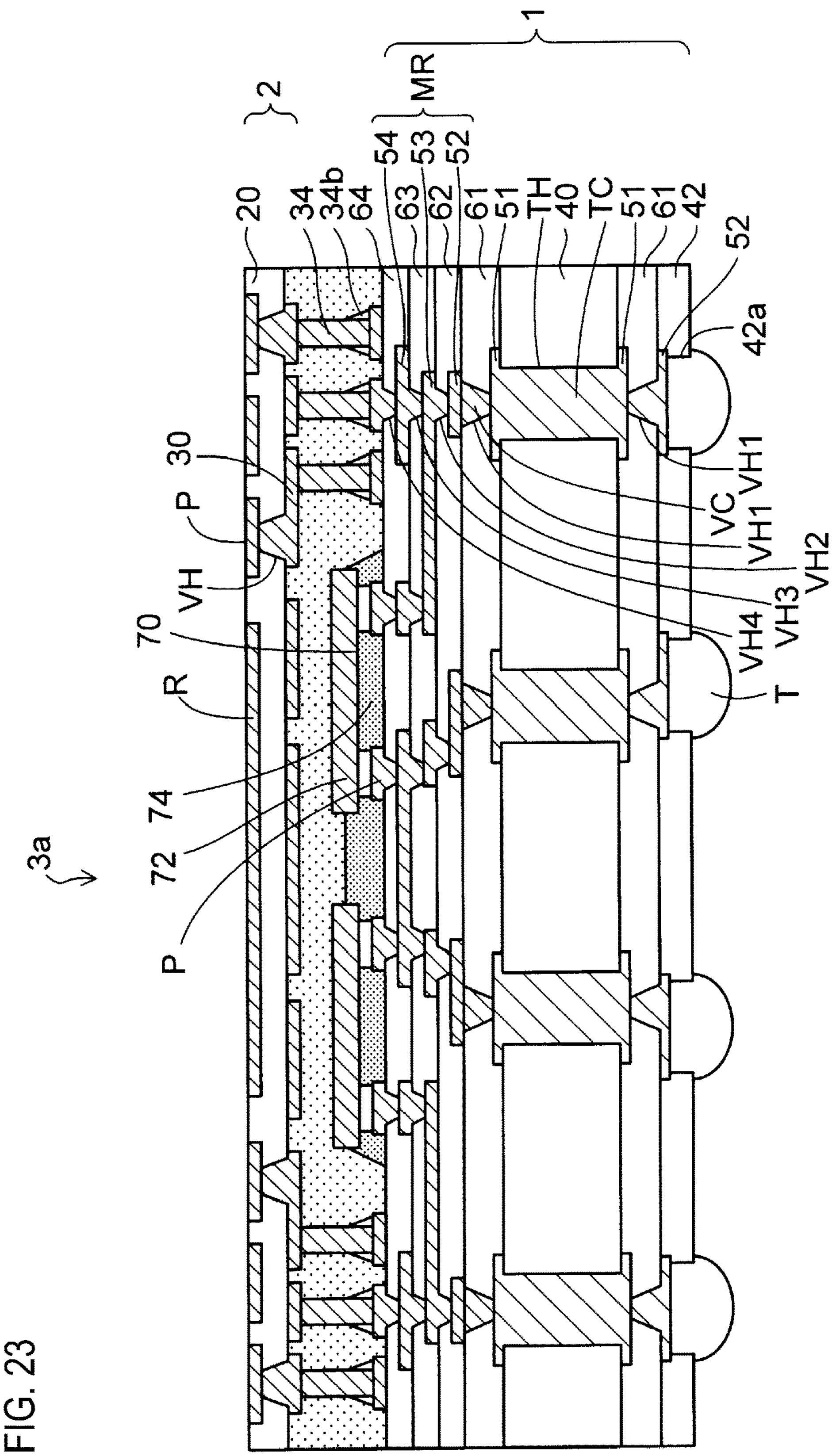
FIG. 23 is a sectional view showing an electronic component device according to a first modification example of the first exemplary embodiment.

FIG. 23 shows an electronic component device 3*a* according to a first modification example of the first exemplary embodiment. Similarly to the electronic component device 3*a* according to the first modification shown in FIG. 23, the solder resist layer 24 on the lower surface side of the upper coreless wiring substrate 2 may be omitted in the electronic component device 3 shown in FIG. 20. In this manner, the electronic component device can be made thinner by the thickness (for example, 20 μm) of the solder resist layer 24.

Figure 24:
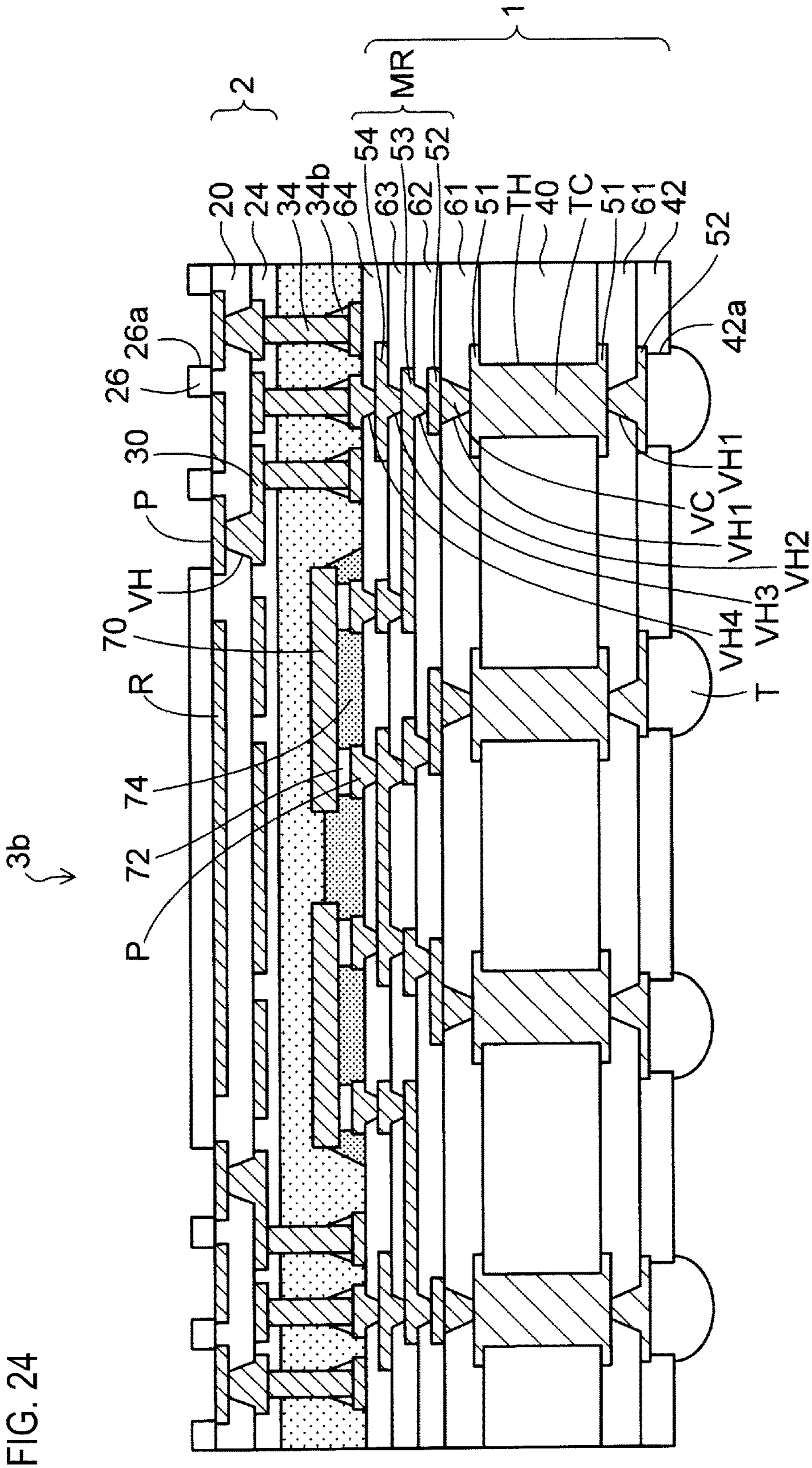
FIG. 24 is a sectional view showing an electronic component device according to a second modification example of the first exemplary embodiment.

FIG. 24 shows an electronic component device 3*b* according to a second modification example of the first exemplary embodiment. As in the electronic component device 3*b* according to the second modification shown in FIG. 24, a solder resist layer 26 formed with opening portions 26*a* on the pads P may be formed on the upper surface side of the upper coreless wiring substrate 2 in the electronic component device 3 shown in FIG. 20.

In this manner, solder of the solder electrodes 96 can be blocked by the solder resist layer 26 when the other semiconductor package 8 is connected to the pads P of the upper coreless wiring substrate 2 as described above with reference to FIG. 22. Thus, even if the pitch of the pads P is made narrower, electric short-circuit among the solder electrodes 96 can be prevented.

Figure 25:
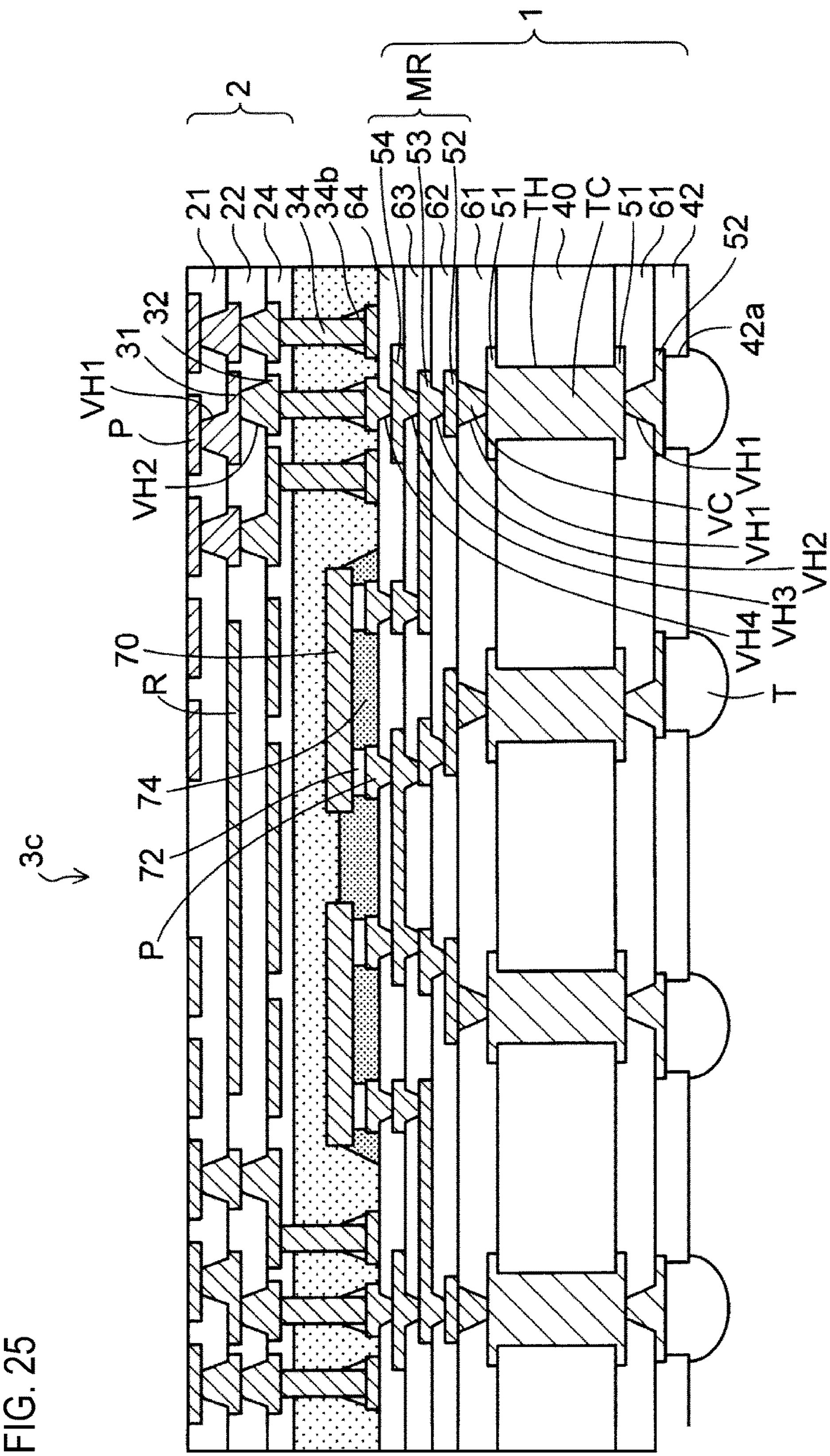
FIG. 25 is a sectional view showing an electronic component device according to a third modification example of the first exemplary embodiment.

FIG. 25 shows an electronic component device 3*c* according to a third modification example of the first exemplary embodiment. As shown in FIG. 25, in the electronic component device 3*c* according to the third modification example, the wiring layers of the upper coreless wiring substrate 2 of the electronic component device 3 shown in FIG. 20 are formed into a multilayer wiring layer. Also, the reinforcing layer R is embedded into an insulating layer inside the upper coreless wiring substrate 2.

More specifically, a plurality of pads P are formed and distributed all over an upper surface of a first insulating layer 21. A side surface and a lower surface of each pad P are embedded in the first insulating layer 21. The reinforcing layer R is formed in a central portion of a lower surface of the first insulating layer 21.

Also, a first wiring layer 31 is formed around the reinforcing layer R in the lower surface of the first insulating layer 21. The first wiring layer 31 is connected to the pads P through via conductors in first via holes VH1 formed in the first insulating layer 21.

In addition, a second insulating layer 22 is formed under the first insulating layer 21. The second insulating layer 22 is formed with second via holes VH2. The second via holes VH2 reach the first wiring layer 31. Furthermore, a second wiring layer 32 on formed in a lower surface of the second insulating layer 22. The second wiring layer 32 reaches the first wiring layer 31 through the second via holes VH2.

The metal pillars 34 are connected to the second wiring layer 32 of the upper coreless wiring substrate 2. The other elements are the same as those of the electronic component device 3 shown in FIG. 20.

In the electronic component device 3 shown in FIG. 20, the reinforcing layer R is disposed in the central portion of the upper surface of the insulating layer 20 of the upper coreless wiring substrate 2. It is, therefore, not easy to deal with a request to provide the pads P all over the upper surface of the insulating layer 20.

On the other hand, the electronic component device 3*c* according to the third modification example includes the multilayer wiring layer. The first insulating layer 21 is formed on the reinforcing layer R. It is, therefore, possible to provide the plurality of pads P all over the upper surface of the first insulating layer 21.

Figure 26:
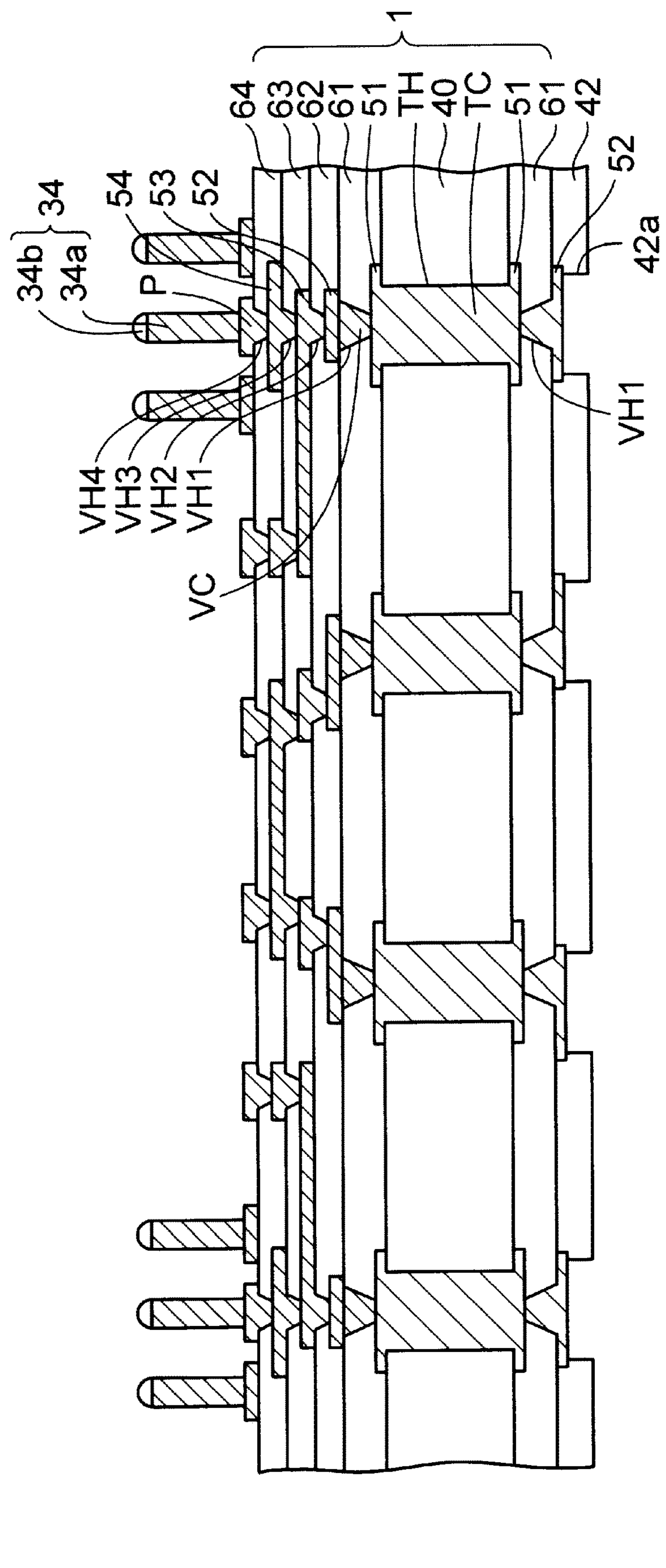
FIG. 26 is a sectional view (part 1) showing another method for manufacturing an electronic component device according to the first exemplary embodiment.
Figure 27:
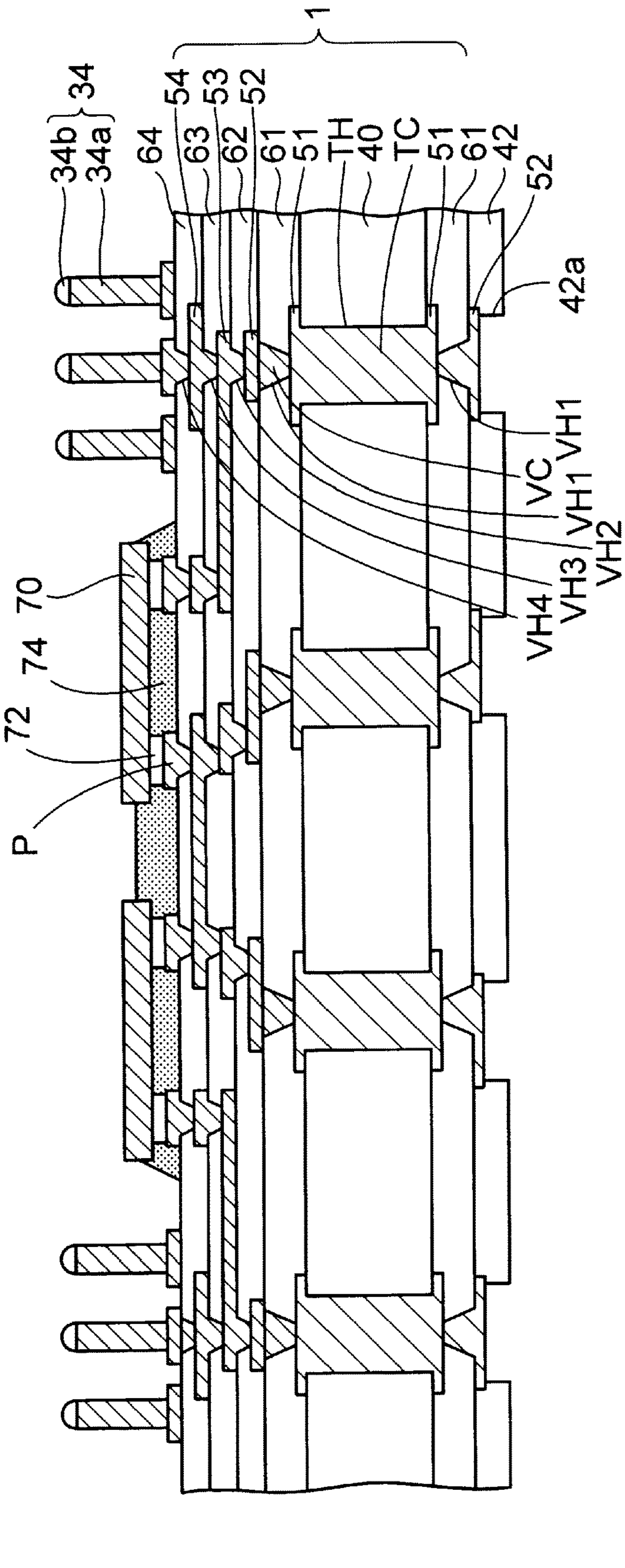
FIG. 27 is a sectional view (part 2) showing said another manufacturing method according to the first exemplary embodiment.
Figure 28:
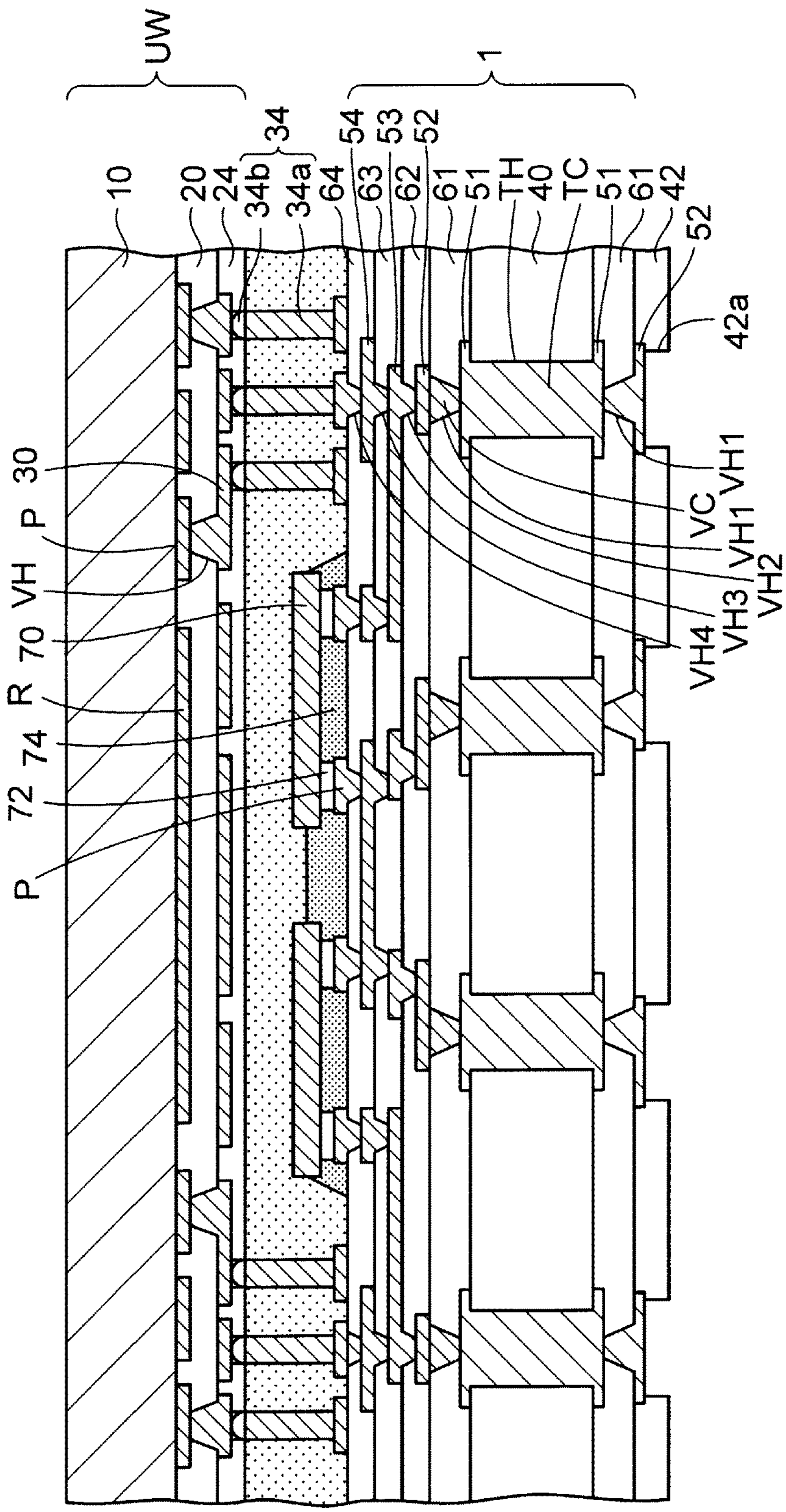
FIG. 28 is a sectional view (part 3) showing said another manufacturing method according to the first exemplary embodiment.

FIGS. 26 to 28 show another method for manufacturing an electronic component device according to the first exemplary embodiment. The method, described above, for manufacturing the electronic component device forms the metal pillars 34 on the upper coreless wiring substrate 2.

In said another method for manufacturing an electronic component device, the lower cored wiring substrate 1 shown in FIG. 13 is prepared (see also FIG. 26). The metal pillars 34 are formed on pads P that are in a circumferential portion of the lower cored wiring substrate 1. The metal pillars 34 are formed in a similar manner to the method which is described above with reference to FIGS. 8A to 9E.

Furthermore, as shown in FIG. 27, the bump electrodes 72 of the semiconductor chips 70 are flip-chip connected to the pads P which are in the central portion of the lower cored wiring substrate 1 where the metal pillars 34 have been formed. After that, the underfill resin 74 is filled under the semiconductor chips 70.

Figure 6B:
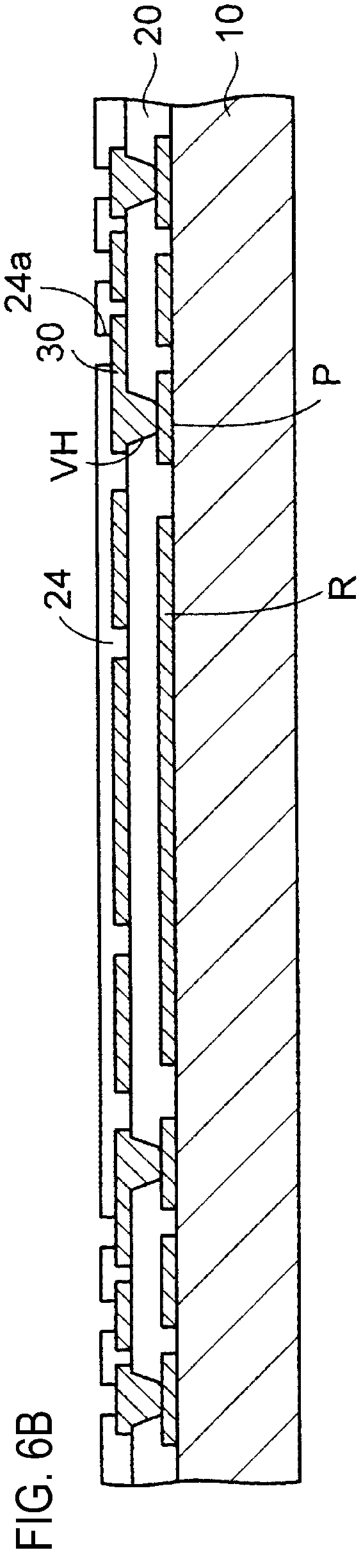

Next, as shown in FIG. 28, the pads P of the upper wiring member UW shown in FIG. 6B are disposed on the metal pillars 34 of the lower cored wiring substrate 1. Also, heat treatment is carried out to reflow the solder layers 34*b* of the metal pillars 34 so as to join the metal pillars 34 of the lower cored wiring substrate 1 to the pads P of the upper wiring member UW. After that, as shown in FIG. 29, the support body 10 is removed from the upper wiring member UW.

Figure 29:
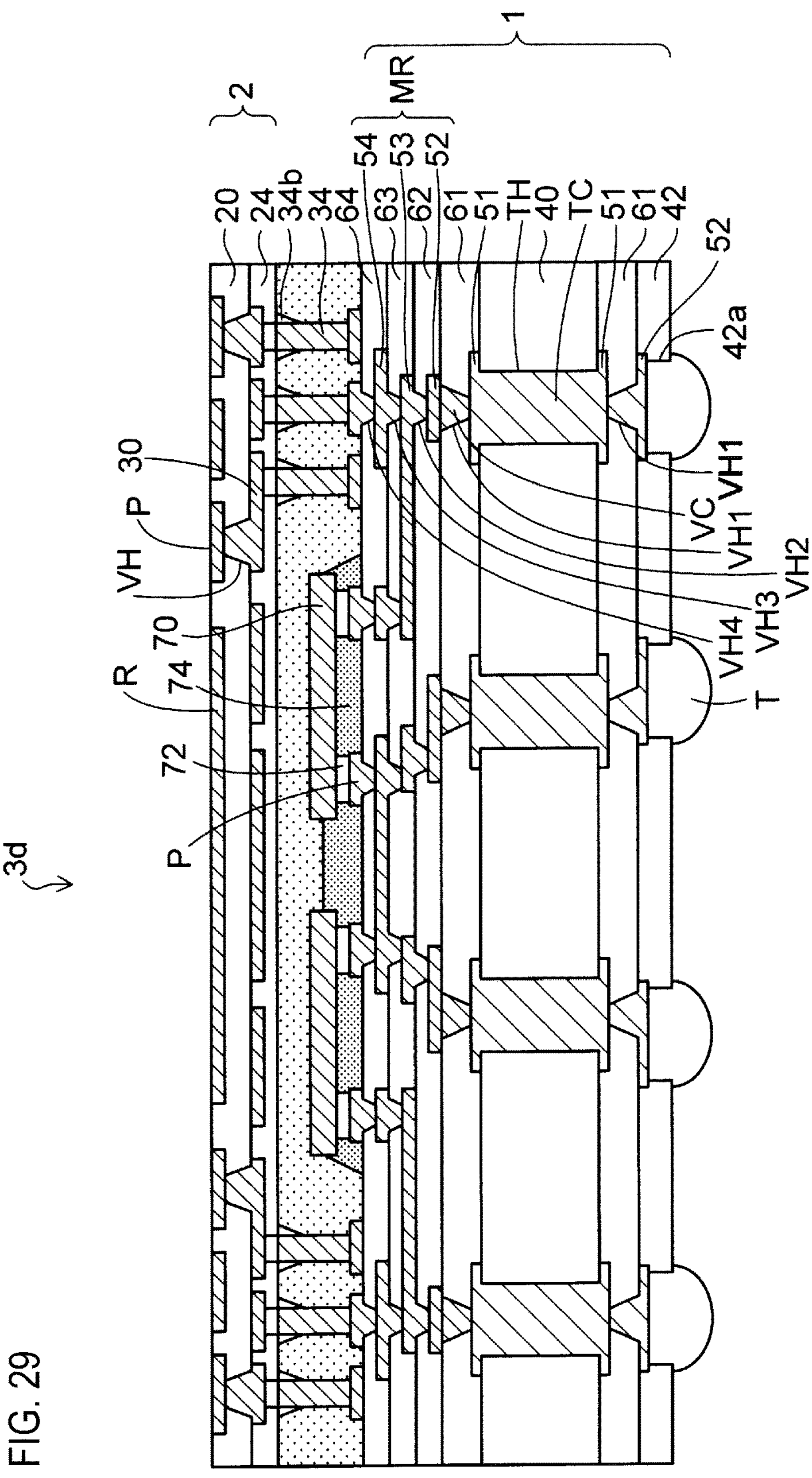
FIG. 29 is a sectional view showing the electronic component device obtained by said another manufacturing method according to the first exemplary embodiment.

As a result, as shown in FIG. 29, an electronic component device 3*d* having substantially the same structure as the electronic component device 3 shown in FIG. 20 is obtained. In the electronic component device 3 shown in FIG. 20, the solder layers 34*b* of the metal pillars 34 are joined to the pads P of the lower cored wiring substrate 1. To the contrary, in the electronic component device 3*d* shown in FIG. 28, the solder layers 34*b* of the metal pillars 34 are joined to the pads P of the upper coreless wiring substrate 2.

Second Exemplary Embodiment

Figure 32:
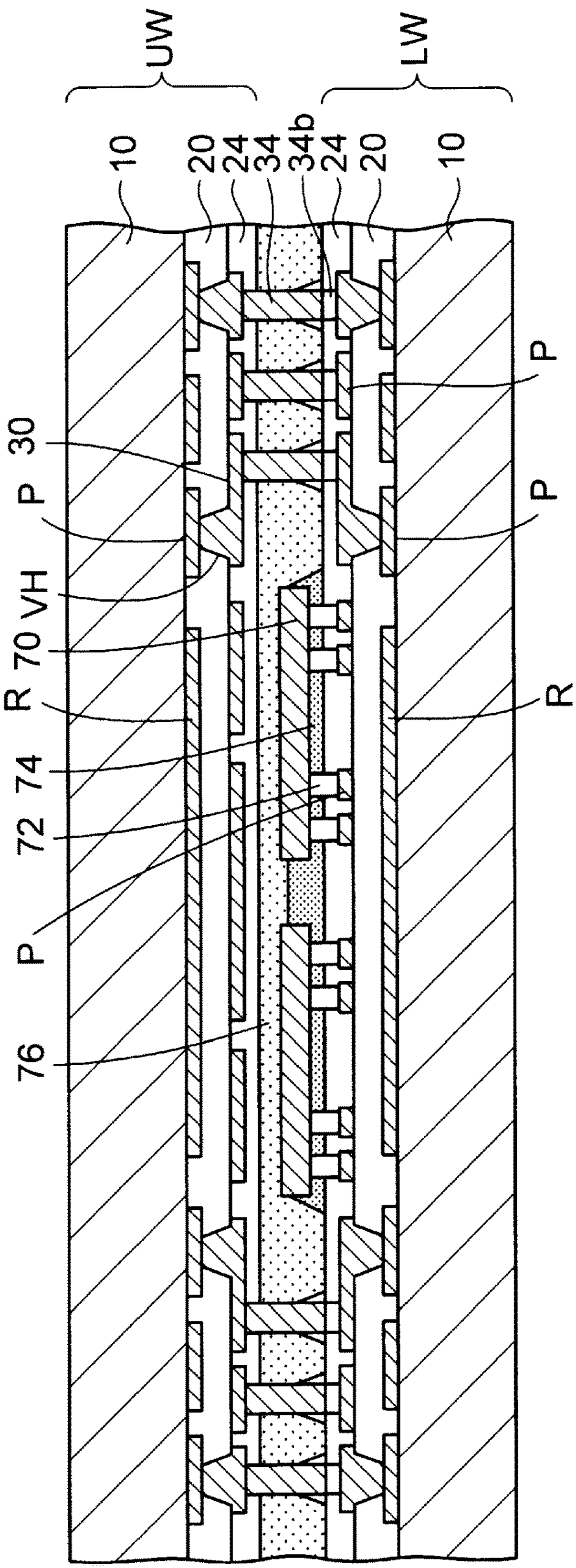
FIG. 32 is a sectional view (part 3) showing the manufacturing method according to the second exemplary embodiment.
Figure 33:
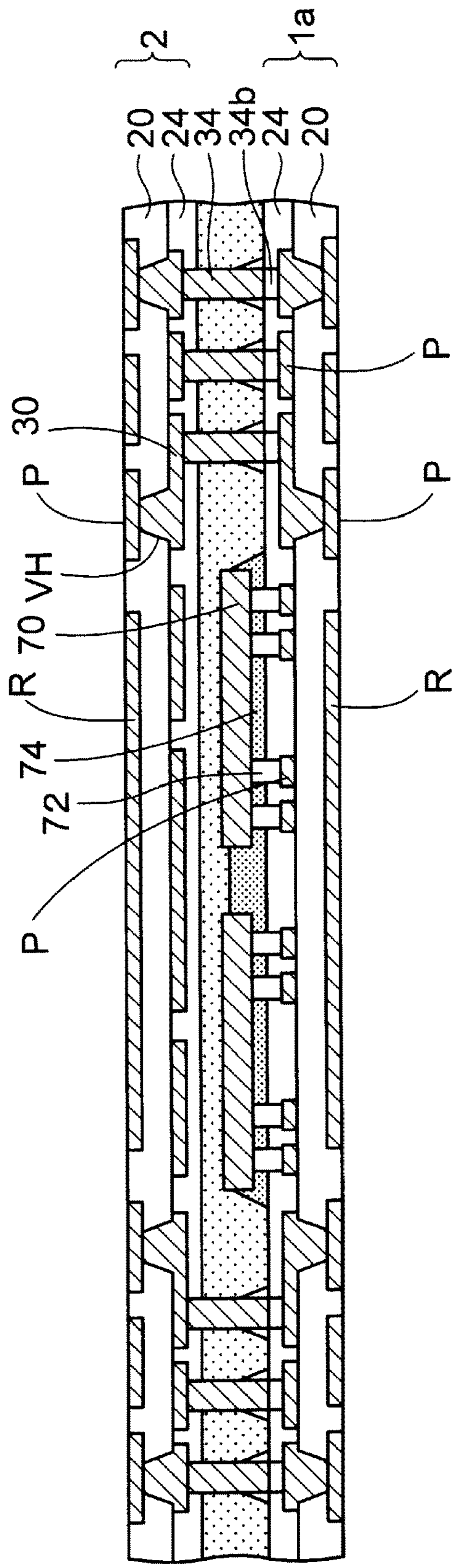
FIG. 33 is a sectional view (part 4) showing the manufacturing method according to the second exemplary embodiment.
Figure 34:
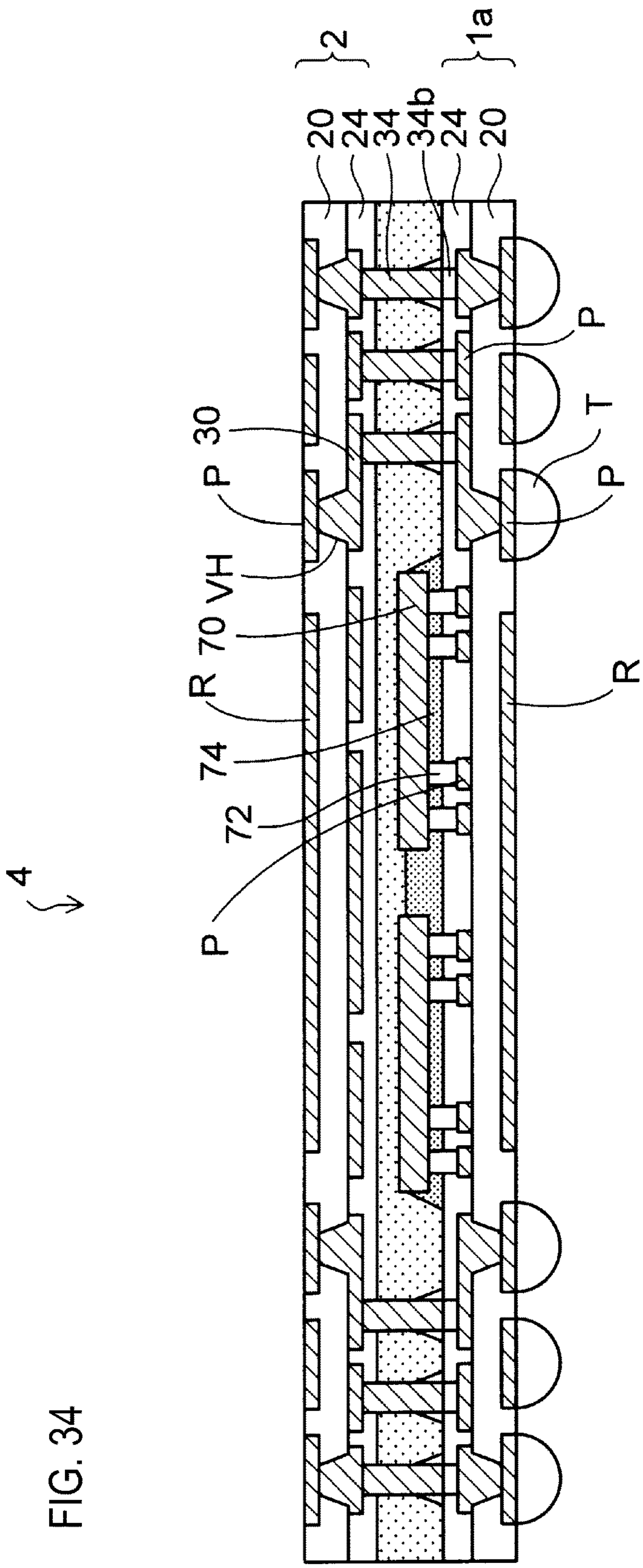
FIG. 34 is a sectional view showing the electronic component device according to the second exemplary embodiment.

FIGS. 30 to 33 show a method for manufacturing an electronic component device according to a second exemplary embodiment. FIG. 34 shows the electronic component device according to the second exemplary embodiment.

In the second exemplary embodiment, both of the lower wiring substrate and the upper wiring substrate are coreless wiring substrates having no core layer.

Figure 30:
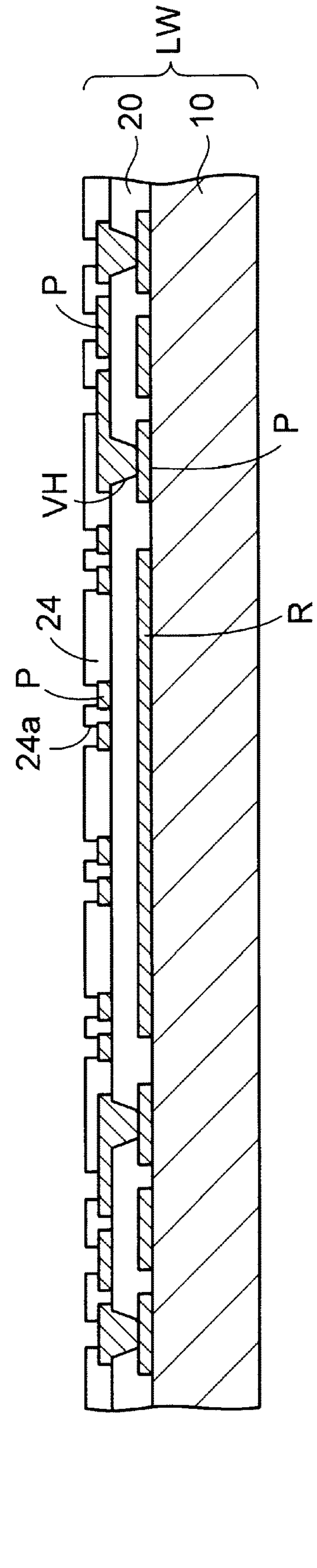
FIG. 30 is a sectional view (part 1) showing a method for manufacturing an electronic component device according to a second exemplary embodiment.

As shown in FIG. 30, the steps of FIG. 3A to FIG. 6B which are described in the first exemplary embodiment are carried out to manufacture a lower wiring member LW having substantially the same structure as the upper wiring member UW shown in FIG. 6B. The lower wiring member LW shown in FIG. 30 is different from the upper wiring member UW shown in FIG. 6B, in that members corresponding to the wiring layer 30 of the upper wiring member UW in FIG. 6B serve as pads P. The other members of the lower wiring member LW in FIG. 30 are the same as those of the upper wiring member UW in FIG. 6B.

Figure 31:
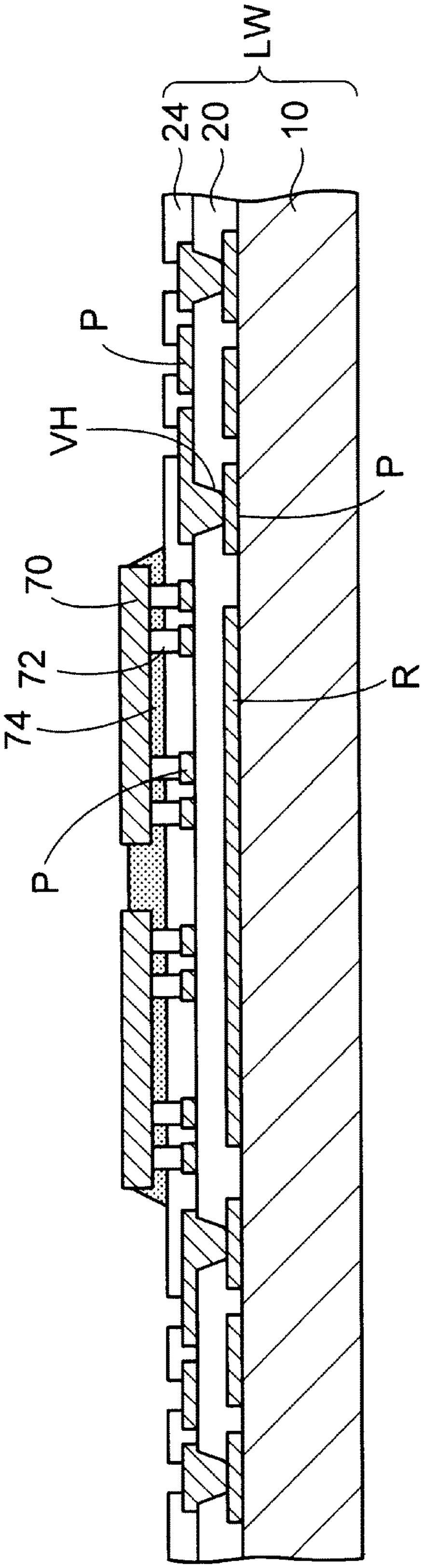
FIG. 31 is a sectional view (part 2) showing the manufacturing method according to the second exemplary embodiment.

Next, as shown in FIG. 31, the bump electrodes 72 of the semiconductor chips 70 are flip-chip connected to the pads P in the central portion of the lower wiring member LW. On this occasion, thermal stress occurs due to a difference in thermal expansion coefficient between the semiconductor chip 70 and the lower cored wiring substrate LW. The thermal stress remains inside the structure shown in FIG. 31 similarly to the first exemplary embodiment. At this time, the structure shown in FIG. 31 is not warped in appearance. This is because the lower wiring member LW still has the support body 10.

After that, the underfill resin 74 is filled into a gap under each semiconductor chip 70.

Next, an upper wiring member UW in which metal pillars 34 are formed with the same structure as that shown in FIG. 8B (first exemplary embodiment) is prepared. The metal pillars 34 of the upper wiring member UW are disposed on the pads P which are in the circumferential portion of the lower wiring member LW as shown in FIG. 32.

Also, heat treatment is carried out to reflow the solder layers 34*b* of the metal pillars 34 so as to join the pads P of the lower wiring member LW to the metal pillars 34 of the upper wiring member UW.

Furthermore, the sealing resin 76 is filled between the lower wiring member LW and the upper wiring member UW so as to seal the semiconductor chips 70. After that, as shown in FIG. 33, the supports 10 are removed from the lower wiring member LW and the upper wiring member UW, respectively.

In this manner, a lower coreless wiring substrate 1*a* is obtained from the lower wiring member LW, and the upper coreless wiring substrate 2 is obtained from the upper wiring member UW. The reinforcing layer R and the pads P are exposed on the lower surface side of the insulating layer 20 of the lower coreless wiring substrate 1*a*. Likewise, the reinforcing layer R and the pads P are exposed on the upper surface side of the insulating layer 20 of the upper coreless wiring substrate 2.

Furthermore, as shown in FIG. 34, the external connection terminals T are provided in such a manner that solder balls are mounted on the pads P exposed on the lower surface of the lower wiring substrate 1*a*. After that, the upper coreless wiring substrate 2 and the lower coreless wiring substrate 1*a* may be cut to obtain a product region(s).

In the above-described manner, an electronic component device 4 according to the second exemplary embodiment is obtained.

As shown in FIG. 34, in the electronic component device 4 according to the second exemplary embodiment, the lower coreless wiring substrate 1*a* serves as the lower wiring substrate, and the upper coreless wiring substrate 2 serves as the upper wiring substrate. That is, both of the upper and lower substrates are the coreless substrates.

The bump electrodes 72 of the two semiconductor chips 70 are flip-chip connected to the pads P in the central portion of the lower coreless wiring substrate 1*a*. The underfill resin 74 is filled under the semiconductor chips 70.

Tip ends of the metal pillars 34 formed in the upper coreless wiring substrate 2 are joined to the pads P which are in the circumferential portion of the lower coreless wiring substrate 1*a* by the solder layers 34*b*.

The metal pillars 34 provide a space between the lower coreless wiring substrate 1*a* and the upper coreless wiring substrate 2. The semiconductor chips 70 are housed in the space. Furthermore, the sealing resin 76 is filled between the lower coreless wiring substrate 1*a* and the upper coreless wiring substrate 2. Thus, the semiconductor chips 70 are sealed with the sealing resin 76.

The reinforcing layer R of the lower coreless wiring substrate 1*a* may be electrically independent from any other electric conductive member provided in the lower coreless wiring substrate 1*a*. Also, the reinforcing layer R of the upper coreless wiring substrate 2 may be electrically independent from any other electric conductive member provided in the upper coreless wiring substrate 2.

A distance between (i) the lower surface of the upper coreless wiring substrate 2 (specifically, the lower surface of the solder resist layer 24 of the upper coreless wiring substrate 2) and (ii) each semiconductor chip 70 is equal to or larger than 30 μm.

In the second exemplary embodiment, not only is the reinforcing layer R formed on the upper surface (outer surface) side of the insulating layer 20 of the upper coreless wiring substrate 2, but also the reinforcing layer R is formed on the lower surface (outer surface) side of the insulating layer 20 of the lower coreless wiring substrate 1*a*.

As a result, occurrence of warpage can be suppressed by the effect of the reinforcing layers R on the both sides even if the residual stress in the lower coreless wiring substrate 1*a* mounted with the semiconductor chips 70 is released after the supports 10 are removed from the lower wiring member LW and the upper wiring member UW, respectively.

Also, since the both of the lower wiring substrate 1*a* and the upper wiring substrate 2 are the coreless substrates, it is possible to make the electronic component device 4 thinner than that in the first exemplary embodiment.

Third Exemplary Embodiment

FIGS. 35 to 39 show a method for manufacturing an electronic component device according to a third exemplary embodiment. FIG. 40 shows the electronic component device according to the third exemplary embodiment.

In the third exemplary embodiment, contrary to the first exemplary embodiment, a lower wiring substrate is a lower coreless wiring substrate, and an upper wiring substrate is an upper cored wiring substrate.

Figure 35:
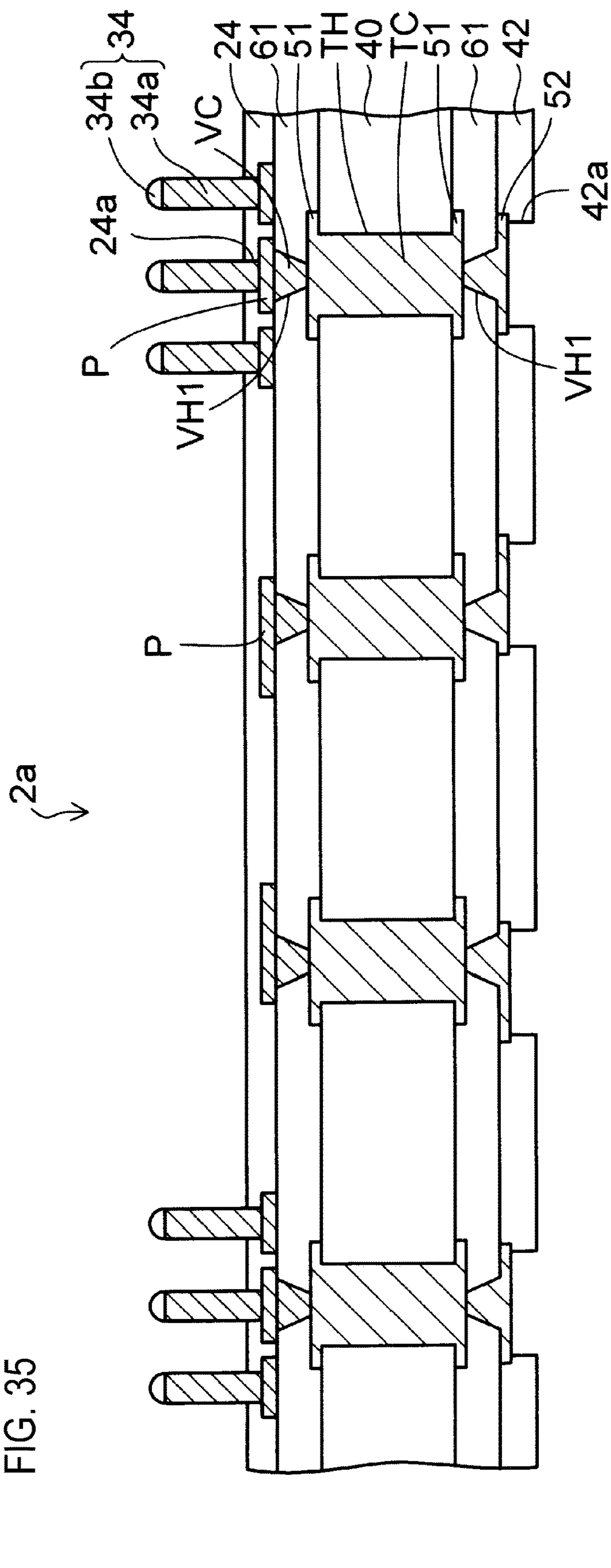
FIG. 35 is a sectional view (part 1) showing a method for manufacturing an electronic component device according to a third exemplary embodiment.

At first, the second wiring layer 52 of the wiring member which is manufactured in the middle of the process shown in FIG. 12 in the first exemplary embodiment is formed as pads P (see FIG. 35). Furthermore, the solder resist layer 24 is formed on the first insulating layer 61. The solder resist layer 24 is formed with opening portions 24*a* on the pads P which are in the circumferential portion of the upper surface of the first insulating layer 61.

Next, the metal pillars 34 are formed on the pads P in the opening portions 24*a* of the solder resist layer 24 in a similar manner to the method of the first exemplary embodiment shown in FIGS. 8A and 9E.

Thereby, an upper cored wiring substrate 2*a* for use in the third exemplary embodiment is obtained. Alternatively, the upper cored wiring substrate 2*a* may be formed in the following manner. That is, the lower cored wiring substrate 1 including the multilayer wiring layer MR (FIGS. 13 and 20) according to the first exemplary embodiment may be used. The metal pillars 34 are provided on the pads P of the multilayer wiring layer MR.

Figure 36:
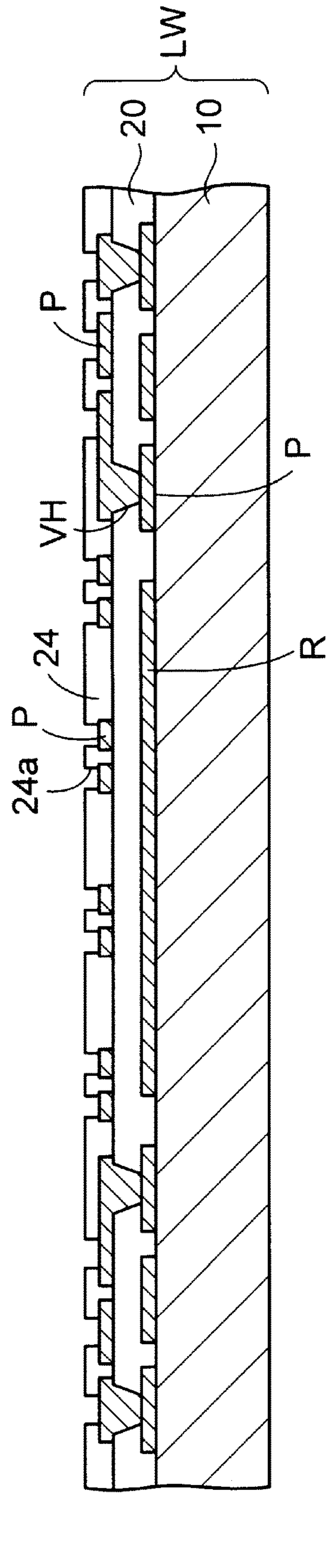
FIG. 36 is a sectional view (part 2) showing the manufacturing method according to the third exemplary embodiment.
Figure 37:
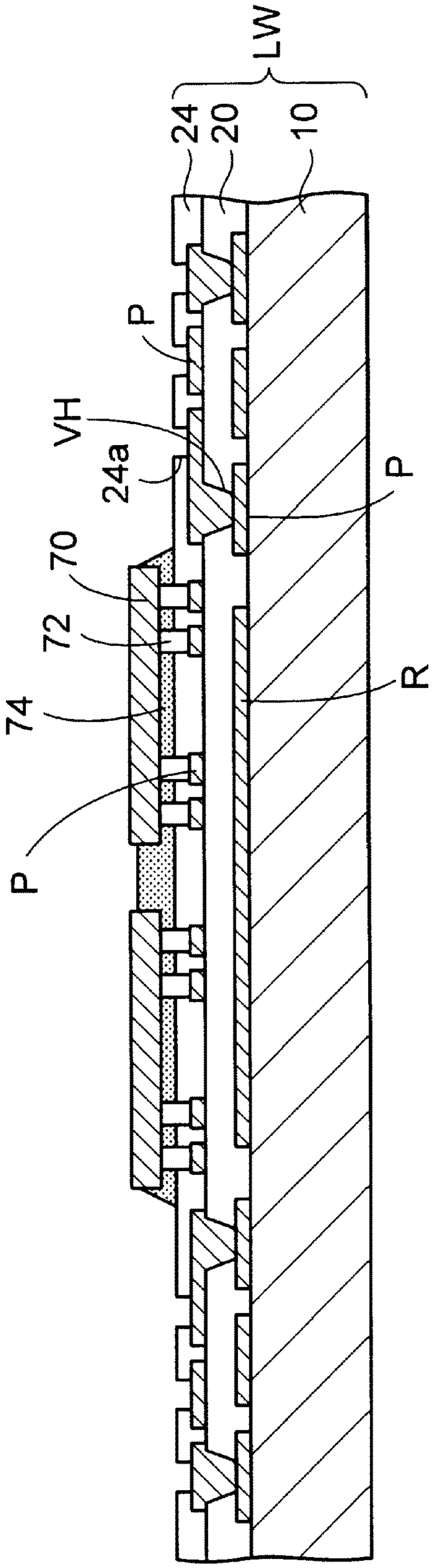
FIG. 37 is a sectional view (part 3) showing the manufacturing method according to the third exemplary embodiment.

Next, as shown in FIG. 36, the lower wiring member LW which is the same as that shown in FIG. 30 according to the second exemplary embodiment is prepared. Next, as shown in FIG. 37, the bump electrodes 72 of the semiconductor chips 70 are flip-chip connected to the pads P in the central portion of the lower wiring member LW in the same manner as in FIG. 31 according to the second exemplary embodiment.

On this occasion, thermal stress is generated due to a difference in thermal expansion coefficient between each semiconductor chip 70 and the lower wiring member LW. The thermal stress resides similarly to the first exemplary embodiment. At this time, similarly to the second exemplary embodiment, the structure shown in FIG. 37 is not warped in appearance. This is because the lower wiring member LW still has the support body 10. After that, the underfill resin 74 is filled under the semiconductor chips 70.

Figure 38:
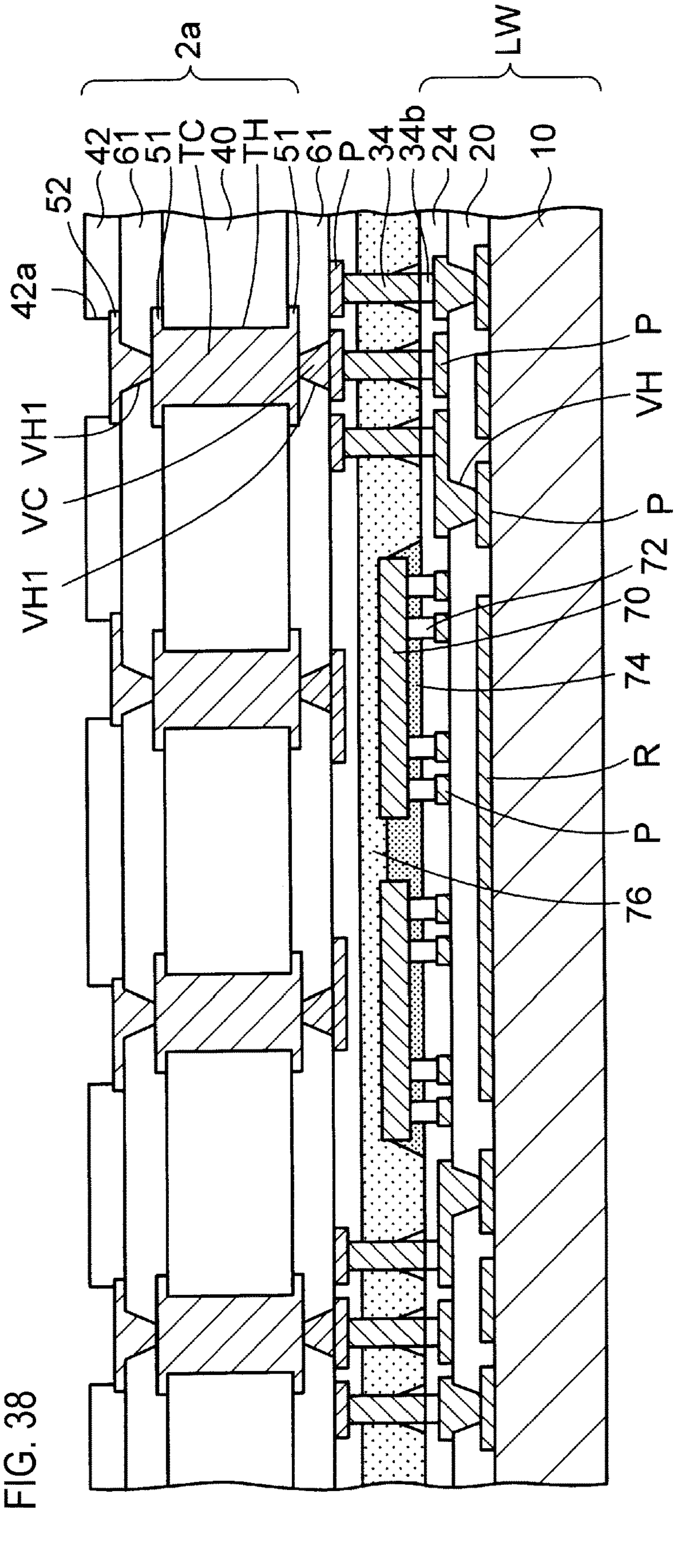
FIG. 38 is a sectional view (part 4) showing the manufacturing method according to the third exemplary embodiment.

Next, as shown in FIG. 38, the metal pillars 34 of the upper cored wiring substrate 2*a* in FIG. 35 are disposed on the pads P of the lower wiring member LW.

Subsequently, heat treatment is carried out to reflow the solder layers 34*b* of the metal pillars 34. Thereby, the metal pillars 34 of the upper cored wiring substrate 2*a* are joined to the pads P of the lower wiring member LW. As a result, the metal pillars 34 provide a space between the lower wiring member LW and the upper cored wiring substrate 2*a*. The semiconductor chips 70 are housed in the space.

Furthermore, the sealing resin 76 is filled between the lower wiring member LW and the upper cored wiring substrate 2*a*. The semiconductor chips 70 are sealed with the sealing resin 76.

Figure 39:
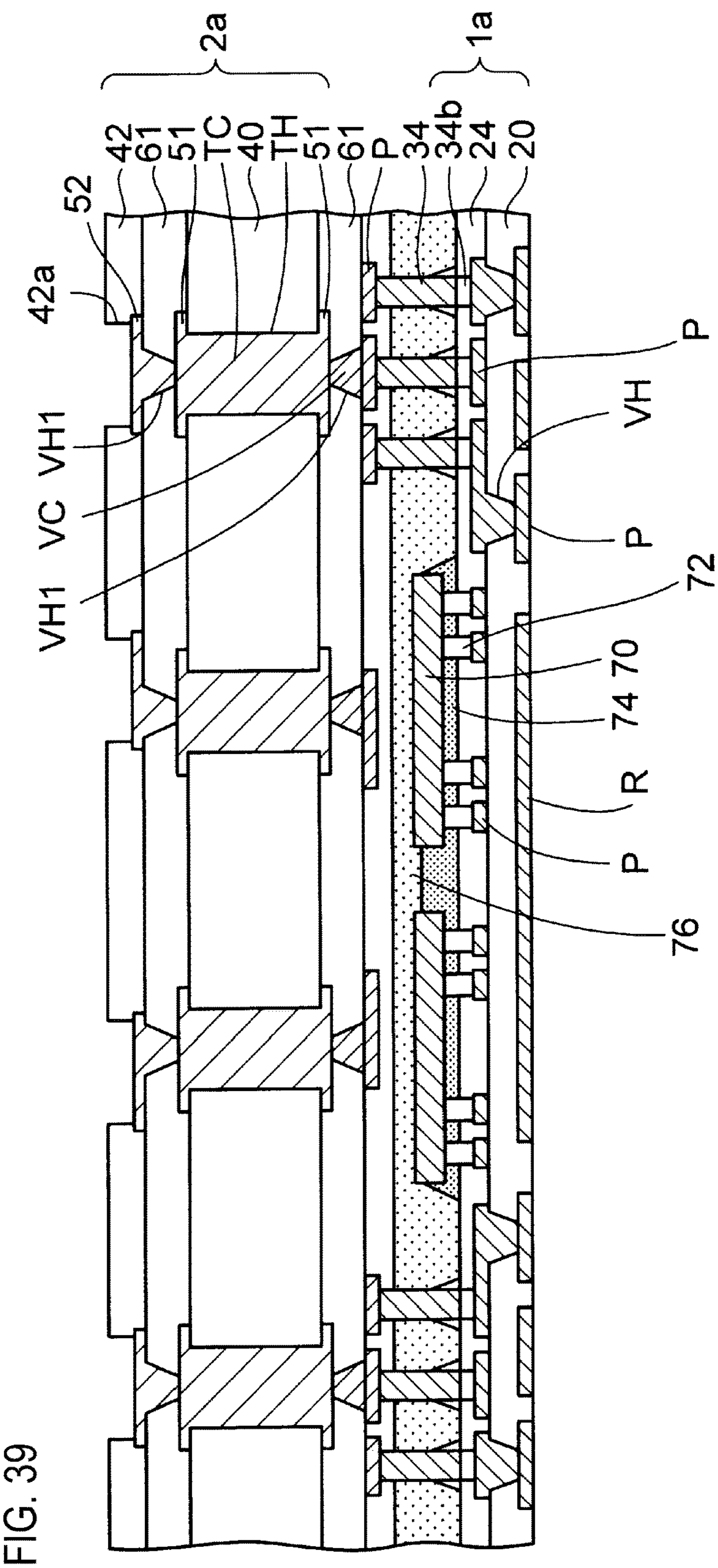
FIG. 39 is a sectional view (part 5) showing the manufacturing method according to the third exemplary embodiment.
Figure 40:
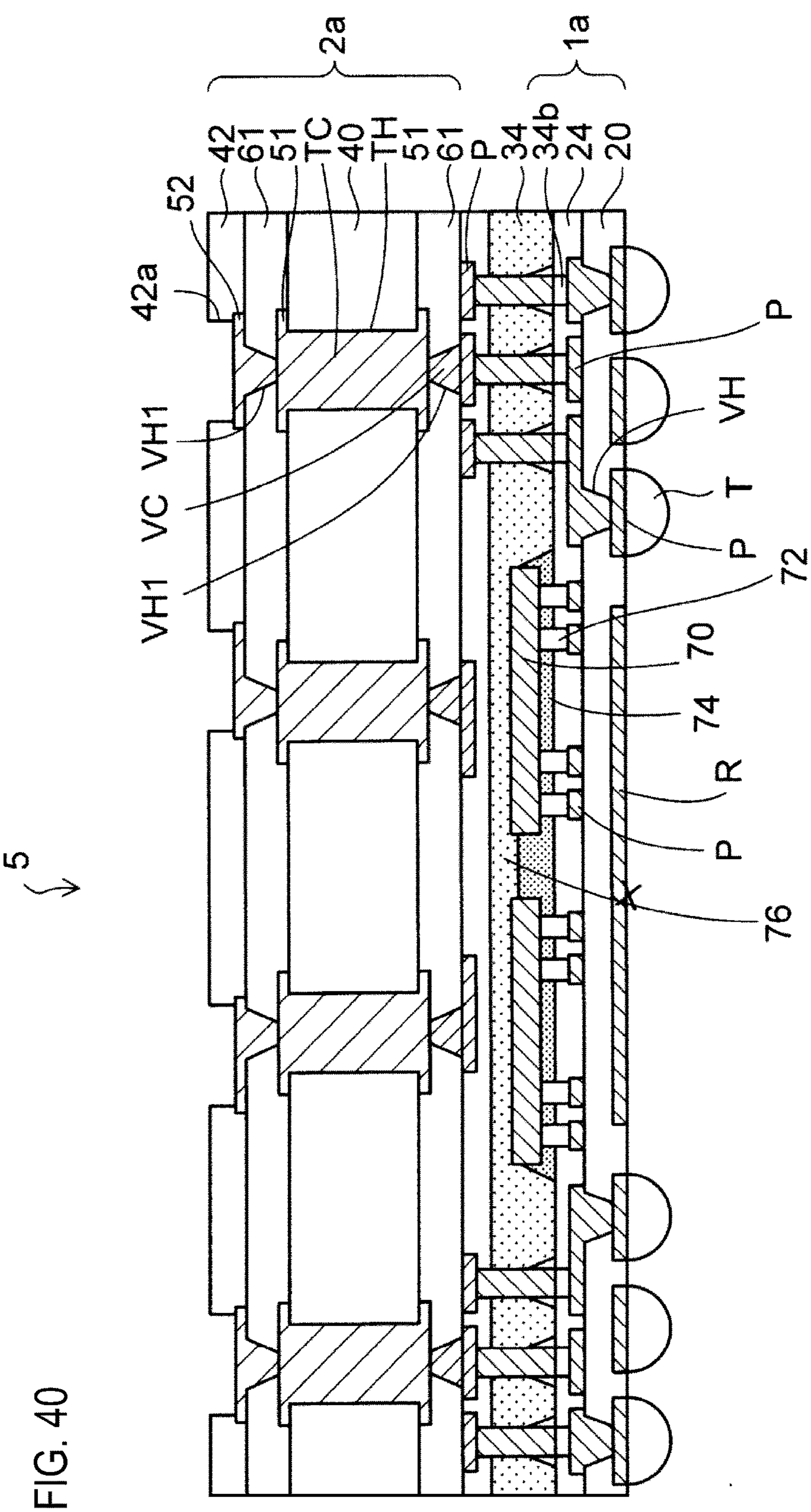
FIG. 40 is a sectional view showing the electronic component device according to the third exemplary embodiment.

Next, as shown in FIG. 39, the support body 10 is removed from the lower wiring member LW shown in FIG. 38. In this manner, the lower coreless wiring substrate 1*a* is obtained. The reinforcing layer R and the pads P are exposed from the lower surface of the lower coreless wiring substrate 1*a*. After that, as shown in FIG. 40, the external connection terminals T are formed in such a manner that solder balls are mounted on the pads P exposed from the lower surface of the lower wiring substrate 1*a*.

After that, the upper cored wiring substrate 2*a* and the lower coreless wiring substrate 1*a* may be cut to obtain a product region(s). In the above-described manner, an electronic component device 5 according to the third exemplary embodiment is obtained.

As shown in FIG. 40, in the electronic component device 5 according to the third exemplary embodiment, the lower wiring substrate is the lower coreless wiring substrate 1*a*, and the upper wiring substrate is the upper cored wiring substrate 2*a*. The bump electrodes 72 of the semiconductor chips 70 are flip-chip connected to the pads P in the central portion of the lower coreless wiring substrate 1*a*.

The underfill resin 74 is filled under the semiconductor chips 70. The metal pillars 34 provide the space between the lower coreless wiring substrate 1*a* and the upper cored wiring substrate 2*a*. The semiconductor chips 70 are housed in the space.

The tip ends of the metal pillars 34 formed in the upper cored wiring substrate 2*a* are joined to the circumferential pads P which are in the circumferential portion of the lower coreless wiring substrate 1*a*, by the solder layers 34*b*.

Furthermore, the sealing resin 76 is filled between the lower coreless wiring substrate 1*a* and the upper cored wiring substrate 2*a* so as to seal the semiconductor chips 70 with the sealing resin 76.

The reinforcing layer R of the lower coreless wiring substrate 1*a* may be electrically independent from any other electric conductive member provided in the electronic component device 5.

A distance between (i) the lower surface of the upper cored wiring substrate 2*a* (specifically, the lower surface of the solder resist layer 24 of the upper cored wiring substrate 2*a*) and (ii) each semiconductor chip 70 is equal to or larger than 30 μm.

In the third exemplary embodiment, the reinforcing layer R is formed on the lower surface (outer surface) side of the insulating layer 20 of the lower coreless wiring substrate 1*a*.

As a result, warping can be suppressed by the effect of the reinforcing layer R on the lower surface (outer surface) side of the lower coreless wiring substrate 1*a* even if the residual stress in the lower coreless wiring substrate 1*a* is released after the support body 10 is removed from the lower wiring member LW mounted with the semiconductor chips 70.

CLAUSE

This disclosure further encompasses various exemplary embodiments, for example, described below.

1. A method for manufacturing an electronic component device, the method comprising:

preparing a cored wiring substrate comprising a core layer;

mounting an electronic component on the cored wiring substrate;

forming a coreless wiring substrate on a support so as to obtain a wiring member, the coreless wiring substrate comprising a reinforcing layer in a region corresponding to the electronic component;

putting the wiring member on the coreless wiring substrate through a connection terminal with the support up, so as to house the electronic component between the cored wiring substrate and the wiring member;

filling sealing resin between the cored wiring substrate and the upper wiring member; and removing the support from the upper wiring member.

2. A method for manufacturing an electronic component device, the method comprising:

forming a first coreless wiring substrate on a first support so as to obtain a first wiring member, the first coreless wiring substrate comprising a first reinforcing layer;

mounting an electronic component on the first wiring member;

forming a second coreless wiring substrate on a second support so as to obtain a second wiring member, the second coreless wiring substrate comprising a second reinforcing layer;

putting the second wiring member on the first wiring member through a connection terminal with the second support up, so as to house the electronic component between the first and second wiring members;

filling sealing resin between the first wiring member and the second wiring member; and removing the first support from the first wiring member;

removing the second support from the second wiring member, wherein the first reinforcing layer and the second reinforcing layer are disposed in a region corresponding to the electronic component.

3. A method for manufacturing an electronic component device, the method comprising:

forming a coreless wiring substrate on a support so as to obtain a wiring member, the coreless wiring substrate comprising a reinforcing layer;

mounting an electronic component on the wiring member;

putting an cored wiring substrate on the wiring member through a connection terminal so as to house the electronic component between the wiring member and the cored wiring substrate, the cored wiring substrate comprising a core layer;

filling sealing resin between the wiring member and the cored wiring substrate; and removing the support from the wiring member, wherein the reinforcing layer is disposed in a region corresponding to the electronic component.

4. The method of any one of the clauses 1 to 3, wherein each reinforcing layer comprises one selected from the group consisting of (i) a structure in which a copper layer, a nickel layer, a palladium layer, and a gold layer are stacked in order from an electronic component side, (ii) a structure in which a copper layer, a nickel layer, and a gold layer are stacked in order from the electronic component side, and (iii) a structure in which a copper layer and a nickel layer are stacked in order from the electronic component side.

5. The method of any one of the clauses 1 to 3, wherein each reinforcing layer is formed with a plurality of holes that penetrate through the reinforcing layer.

6. The method of any one of the clauses 1 to 3, wherein each reinforcing layer has 10 μm to 20 μm in thickness.

7. The method of any one of the clauses 1 and 3, wherein the core layer comprises a fiber-reinforcing-material containing resin layer.

8. The method of any one of the clauses 1 and 3, wherein:

the coreless wiring substrate comprises an insulating layer, via conductors, and a wiring layer the insulating layer and the wiring layer are laminated, the via conductors are disposed in the insulating layer, and each via conductor has a truncated cone shape whose diameter is smaller on an outer side of the electronic component device than on an inner side of the electronic component device.

9. The method of the clause 2, wherein:

each of the first and second coreless wiring substrates comprises an insulating layer, via conductors, and a wiring layer each insulating layer and the corresponding wiring layer are laminated, the via conductors of each of the first and second coreless wiring substrates are disposed in the corresponding insulating layer, and each via conductor has a truncated cone shape whose diameter is smaller on an outer side of the electronic component device than on an inner side of the electronic component device.

10. The method of any one of the clauses 1 to 3, wherein the connection terminal comprises a metal pillar.

What is claimed is:

1. An electronic component device comprising:

a cored wiring substrate comprising a core layer;

an electronic component that is mounted on the cored wiring substrate;

a coreless wiring substrate that is disposed above the cored wiring substrate and the electronic component such that the coreless wiring substrate is spaced from the cored wiring substrate and the electronic component;

a connection terminal that connects the cored wiring substrate and the coreless wiring substrate; and a sealing resin that is filled between the cored wiring substrate and the coreless wiring substrate, wherein the coreless wiring substrate comprises an insulating layer, a wiring layer, and a reinforcing layer, the reinforcing layer being embedded in the insulating layer and provided in a region overlaying the electronic component, the insulating layer comprising a first surface and a second surface opposite to the first surface, the first surface of the insulating layer being opposed to the electronic component, and a surface of the reinforcing layer being flush with the second surface of the insulating layer.

2. The device of claim 1, wherein the reinforcing layer comprises one selected from the group consisting of (i) a structure in which a copper layer, a nickel layer, a palladium layer, and a gold layer are stacked in order from an electronic component side, (ii) a structure in which a copper layer, a nickel layer, and a gold layer are stacked in order from the electronic component side, and (iii) a structure in which a copper layer and a nickel layer are stacked in order from the electronic component side.

3. The device of claim 1, wherein a distance between the electronic component and the first surface of the coreless wiring substrate is equal to or larger than 30 μm.

4. The device of claim 1, wherein the core layer comprises a fiber-reinforcing-material containing resin layer.

5. The device of claim 1, wherein:

the coreless wiring substrate comprises via conductors, the insulating layer and the wiring layer are laminated, the via conductors are disposed in the insulating layer, and each via conductor has a truncated cone shape whose diameter is smaller on an outer side of the electronic component device than on an inner side of the electronic component device.

6. The device of claim 1, wherein the connection terminal comprises a metal pillar.

7. The device of claim 1, wherein the reinforcing layer is at a same height as the wiring layer, and the wiring layer is embedded in the insulating layer.

8. The device of claim 1, wherein the core layer is larger in thickness than the insulating layer of the coreless wiring substrate.

* * * * *